(12) United States Patent
Okuda et al.

(10) Patent No.: US 10,374,047 B2
(45) Date of Patent: Aug. 6, 2019

(54) SEMICONDUCTOR DEVICE AND MANUFACTURING METHOD THEREOF

(71) Applicant: ROHM CO., LTD., Kyoto (JP)

(72) Inventors: Hajime Okuda, Kyoto (JP); Adrian Joita, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/889,507

(22) Filed: Feb. 6, 2018

(65) Prior Publication Data

US 2018/0226480 A1 Aug. 9, 2018

(30) Foreign Application Priority Data

Feb. 7, 2017 (JP) .................. 2017-020726

(51) Int. Cl.
| | |
|---|---|
| H01L 29/66 | (2006.01) |
| H01L 29/423 | (2006.01) |
| H01L 29/78 | (2006.01) |
| H01L 29/739 | (2006.01) |
| H01L 27/092 | (2006.01) |
| H01L 21/265 | (2006.01) |
| H01L 29/40 | (2006.01) |
| H01L 29/08 | (2006.01) |
| H01L 29/10 | (2006.01) |

(52) U.S. Cl.
CPC .... H01L 29/4236 (2013.01); H01L 21/26586 (2013.01); H01L 27/092 (2013.01); H01L 27/0922 (2013.01); H01L 29/407 (2013.01); H01L 29/42376 (2013.01); H01L 29/66348 (2013.01); H01L 29/66734 (2013.01); H01L 29/7397 (2013.01); H01L 29/7813 (2013.01); H01L 29/083 (2013.01); H01L 29/1095 (2013.01)

(58) Field of Classification Search
CPC .................................................. H01L 29/4236
USPC ........................................................ 257/330
See application file for complete search history.

(56) References Cited

U.S. PATENT DOCUMENTS

| | | | |
|---|---|---|---|
| 2016/0020315 A1* | 1/2016 | Hirler | H01L 29/0696 257/330 |
| 2016/0133742 A1* | 5/2016 | Okuda | H01L 29/7813 257/330 |
| 2018/0323190 A1* | 11/2018 | Feng | H01L 27/088 |

FOREIGN PATENT DOCUMENTS

| | | | | |
|---|---|---|---|---|
| WO | WO-2012/165329 A1 | 12/2012 | | |
| WO | WO-2012165329 A1 | * 12/2012 | ......... | H01L 29/1095 |

* cited by examiner

*Primary Examiner* — Ajay Arora

(57) ABSTRACT

A semiconductor device includes a semiconductor layer of a first conductivity type having a main surface at which a trench is formed, a gate insulating layer formed along a side wall of the trench, a gate electrode embedded in the trench with the gate insulating layer interposed therebetween and having an upper surface located below the main surface of the semiconductor layer, a second conductivity type region formed in a surface layer portion of the main surface of the semiconductor layer and facing the gate electrode with the gate insulating layer interposed therebetween, a first conductivity type region formed in a surface layer portion of the second conductivity type region and facing the gate electrode with the gate insulating layer interposed therebetween, and a side wall insulating layer covering the side wall of the trench in a recessed portion defined by the side wall of the trench and the upper surface of the gate electrode.

19 Claims, 41 Drawing Sheets

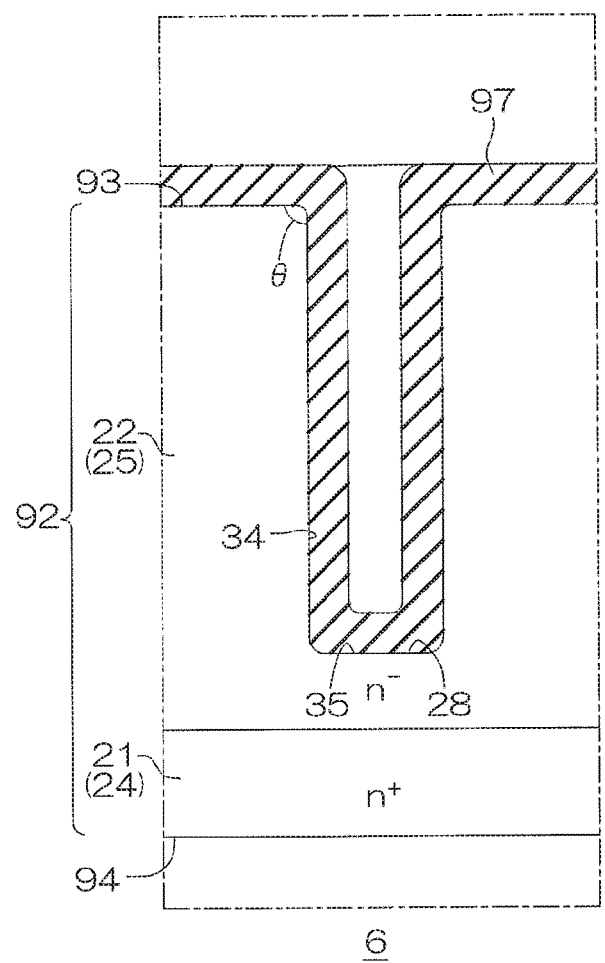

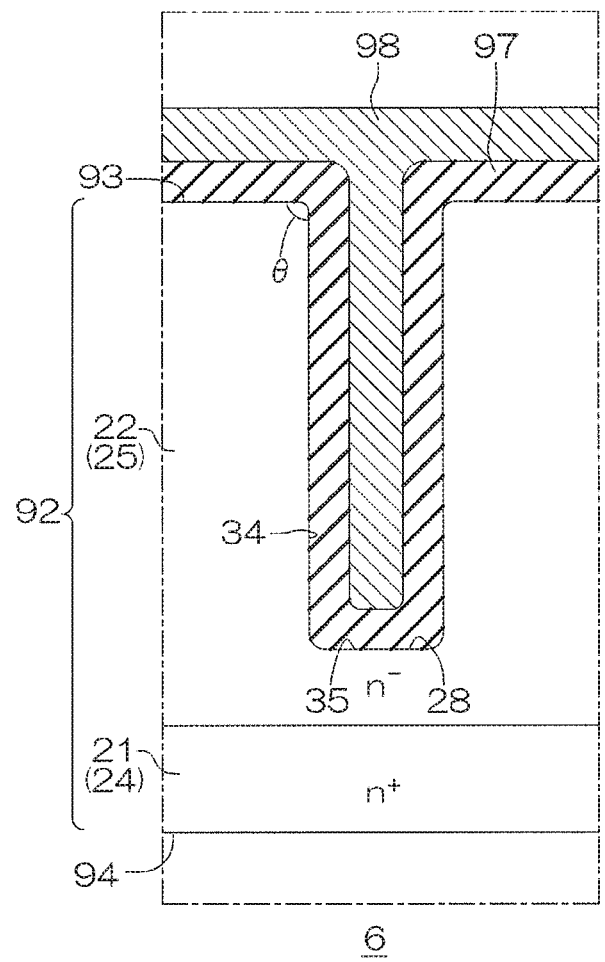

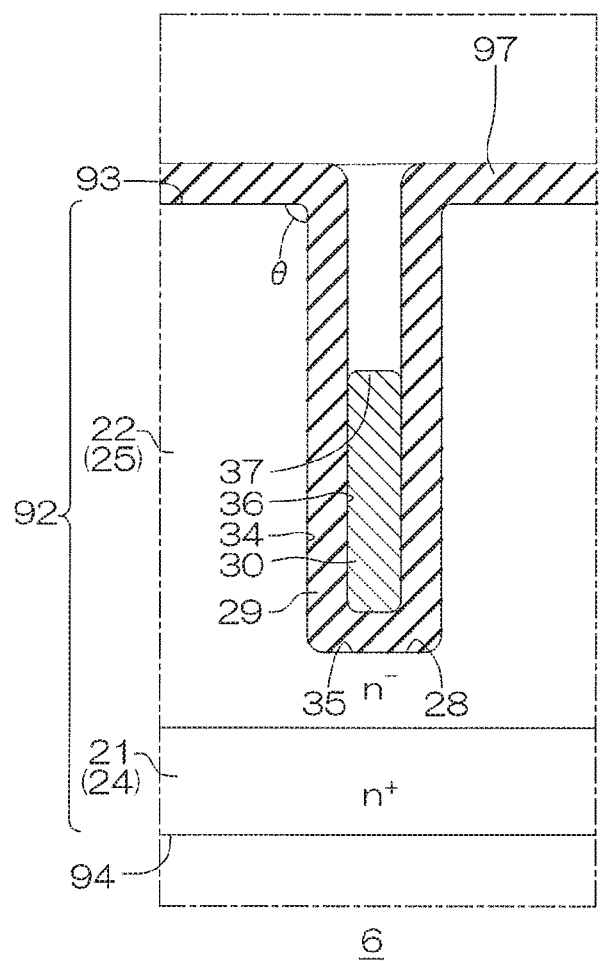

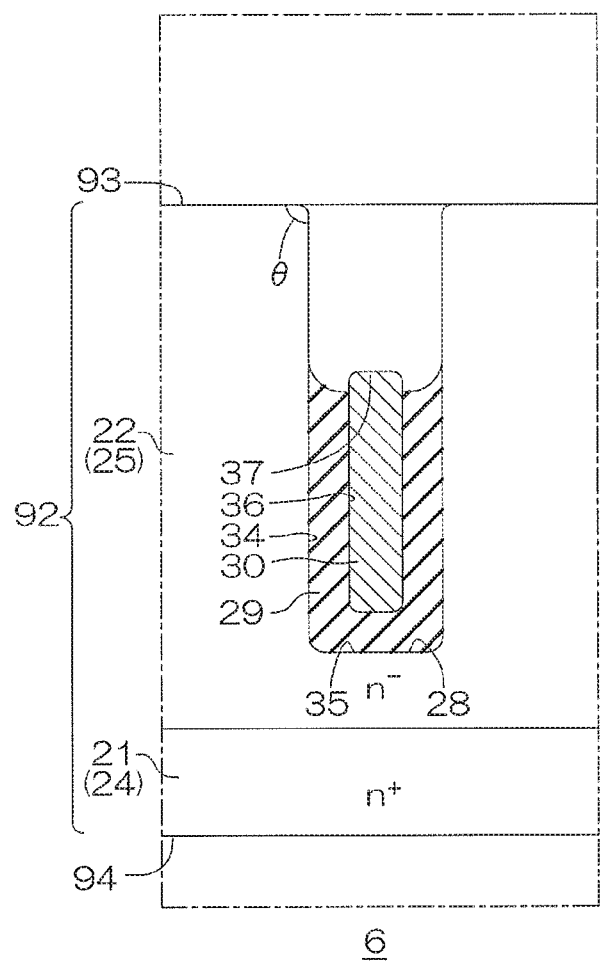

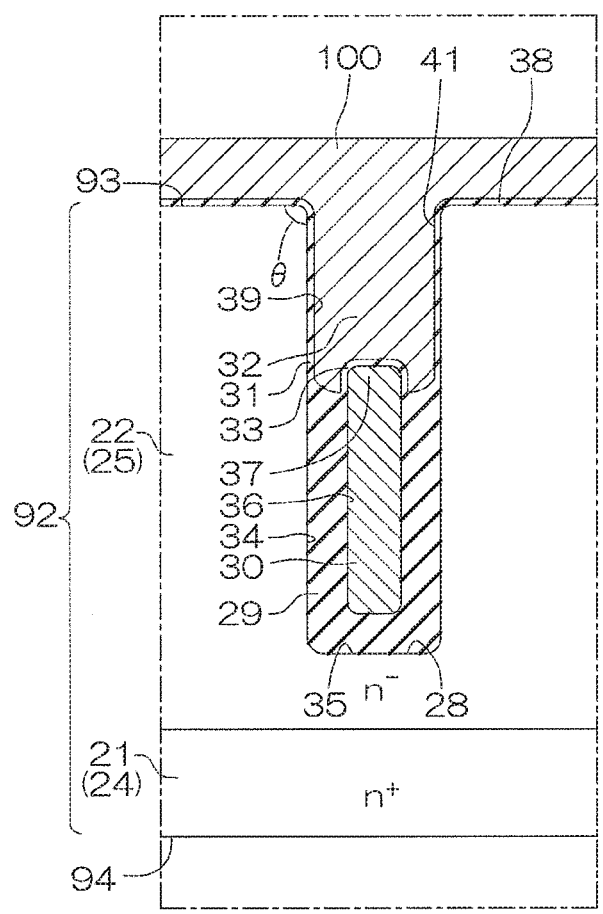

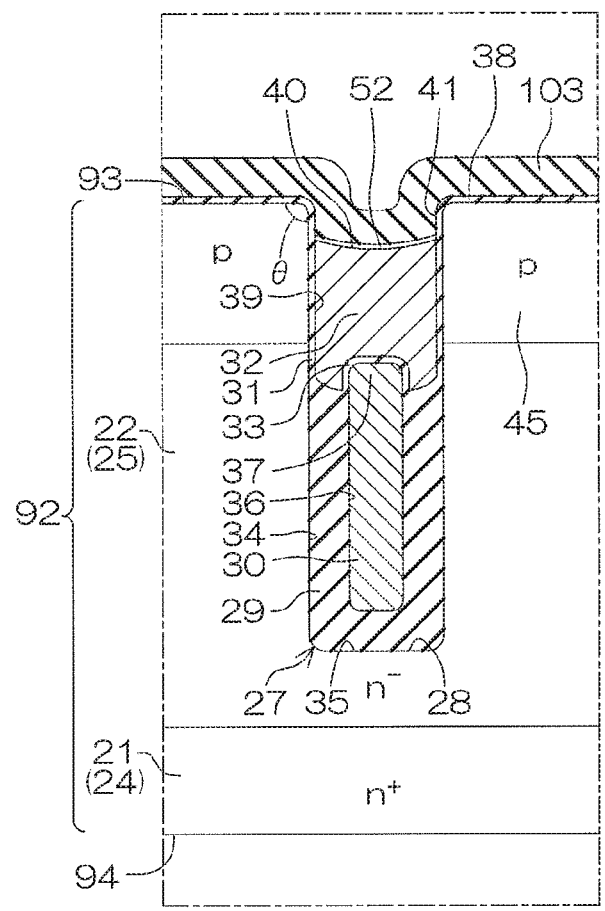

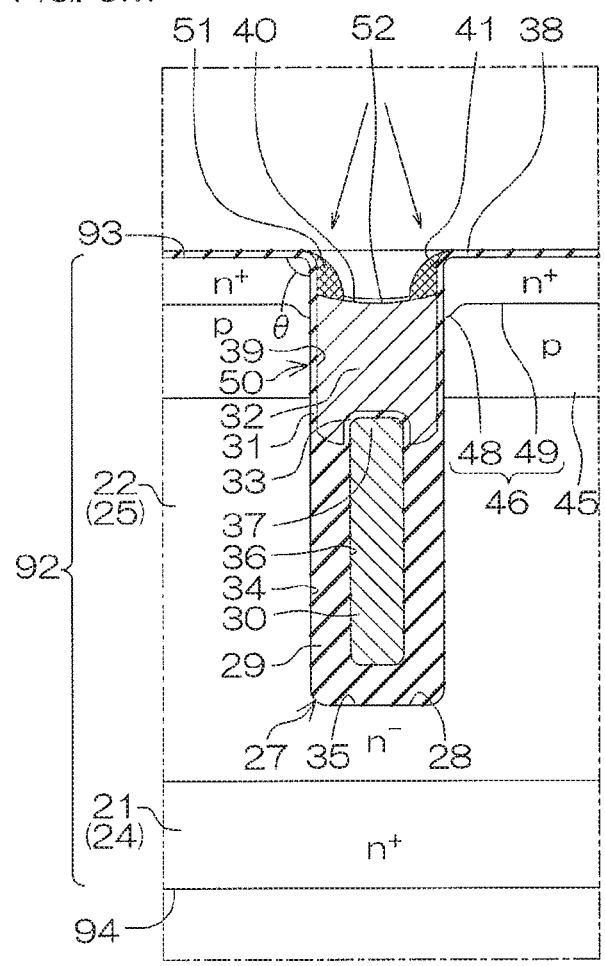

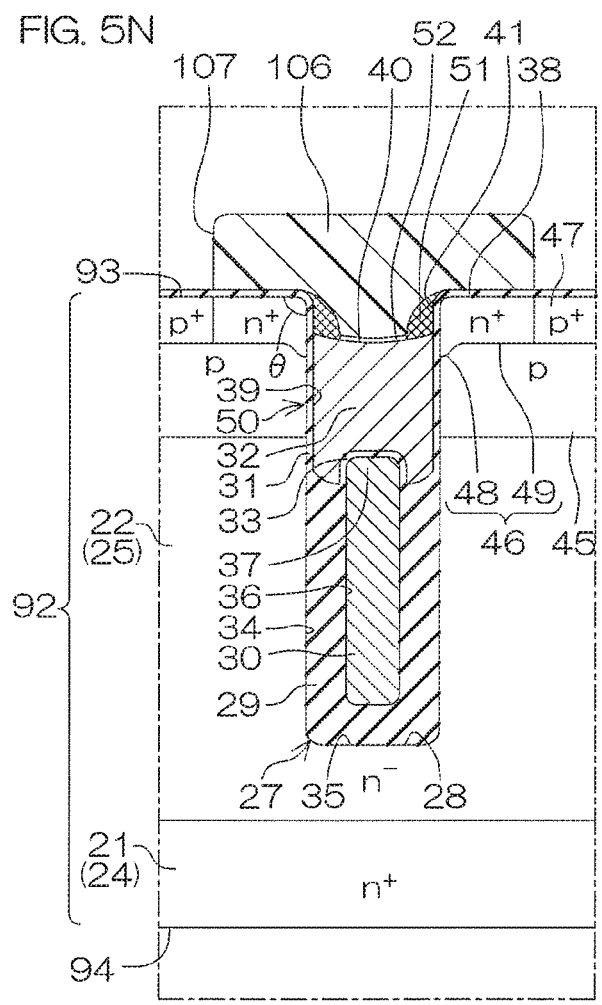

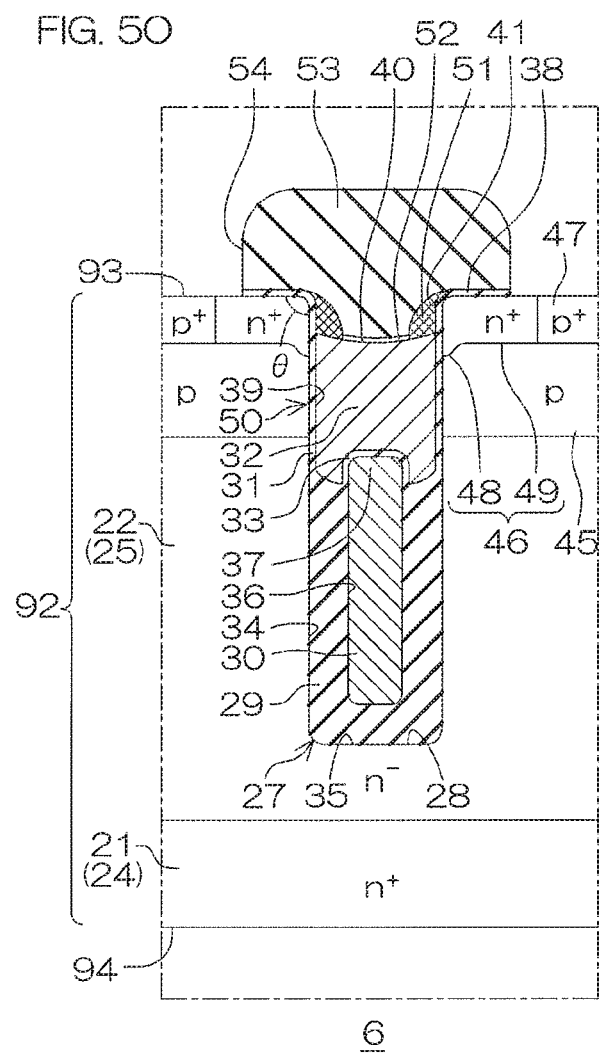

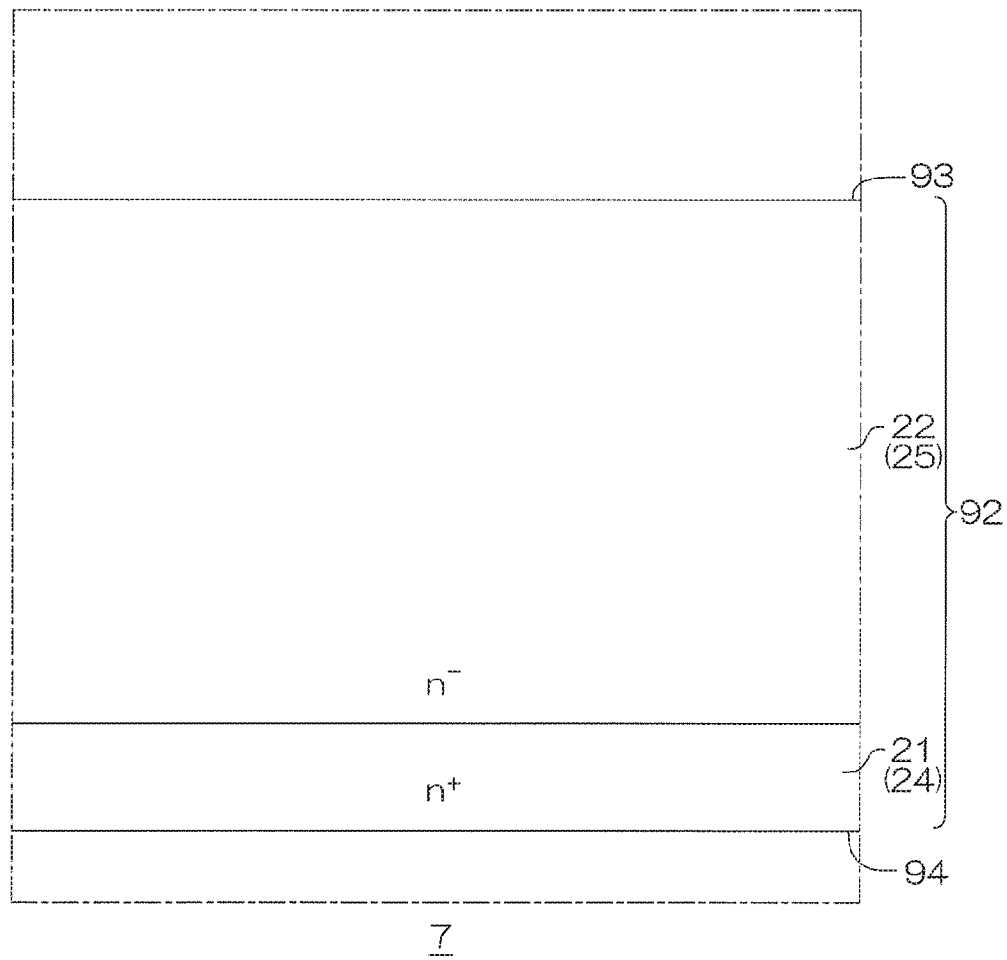

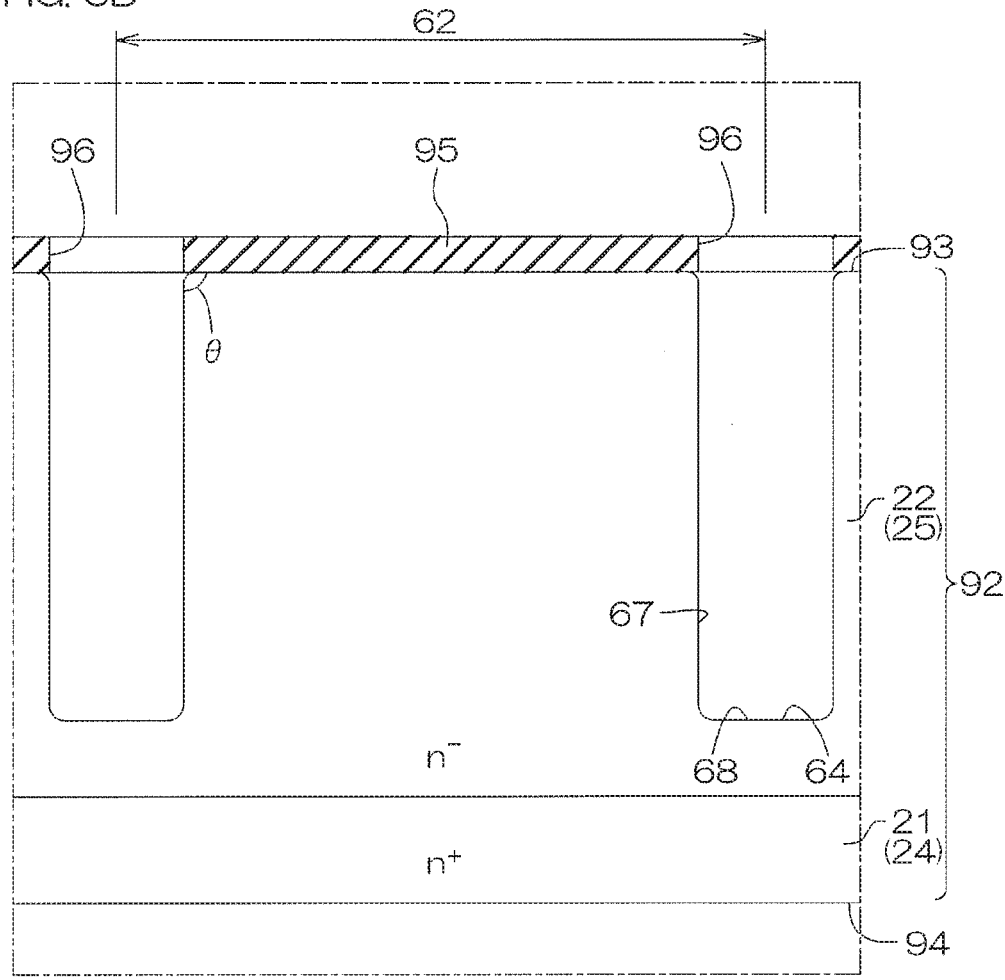

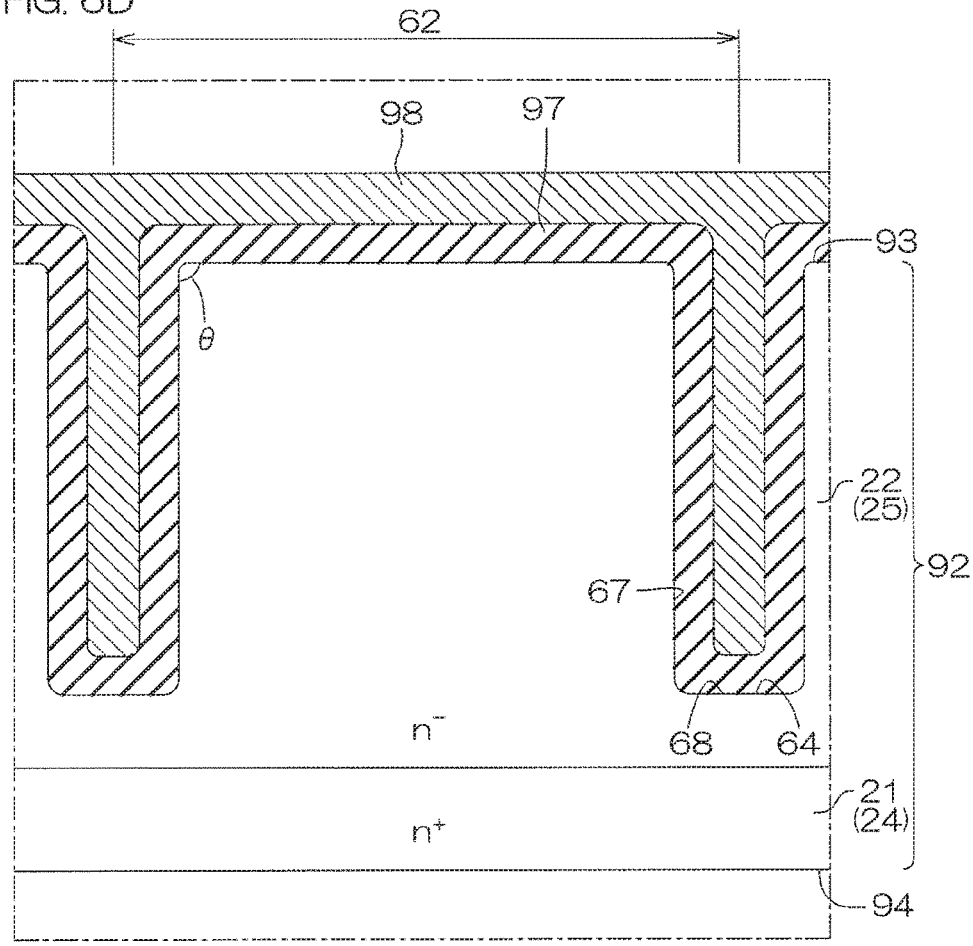

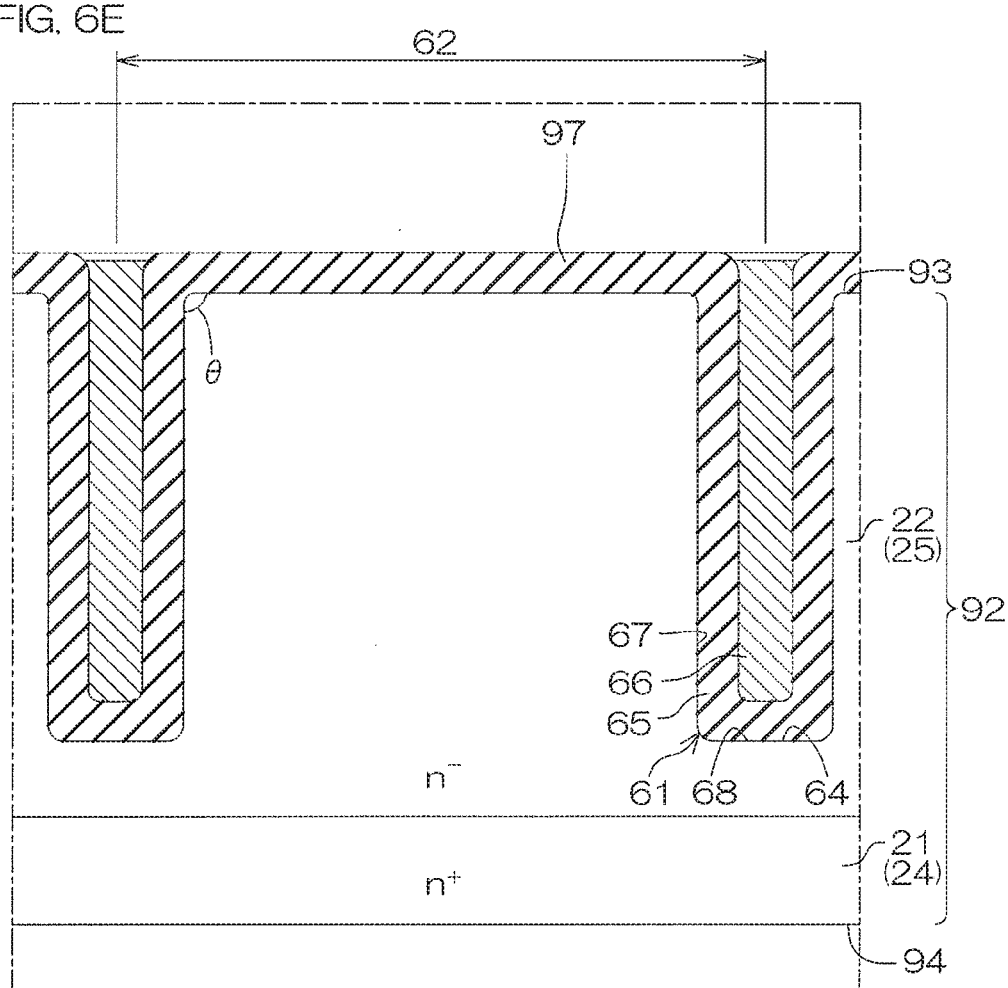

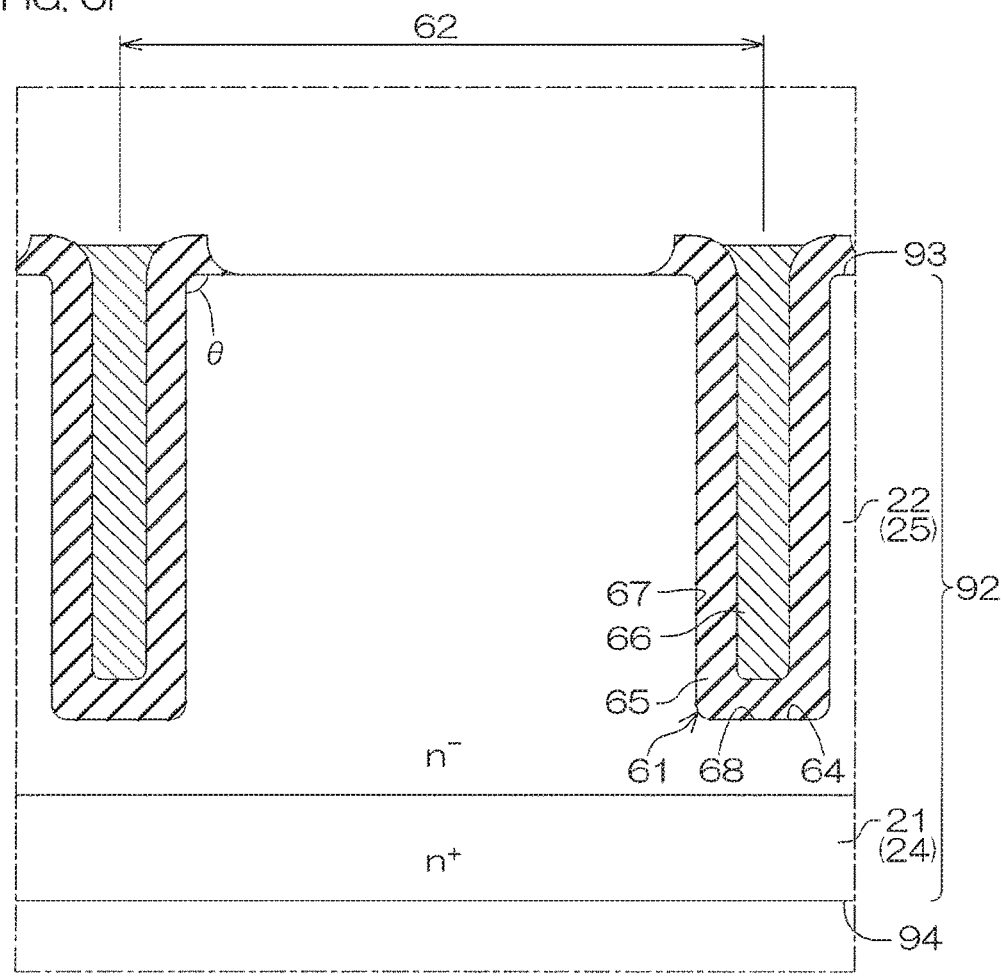

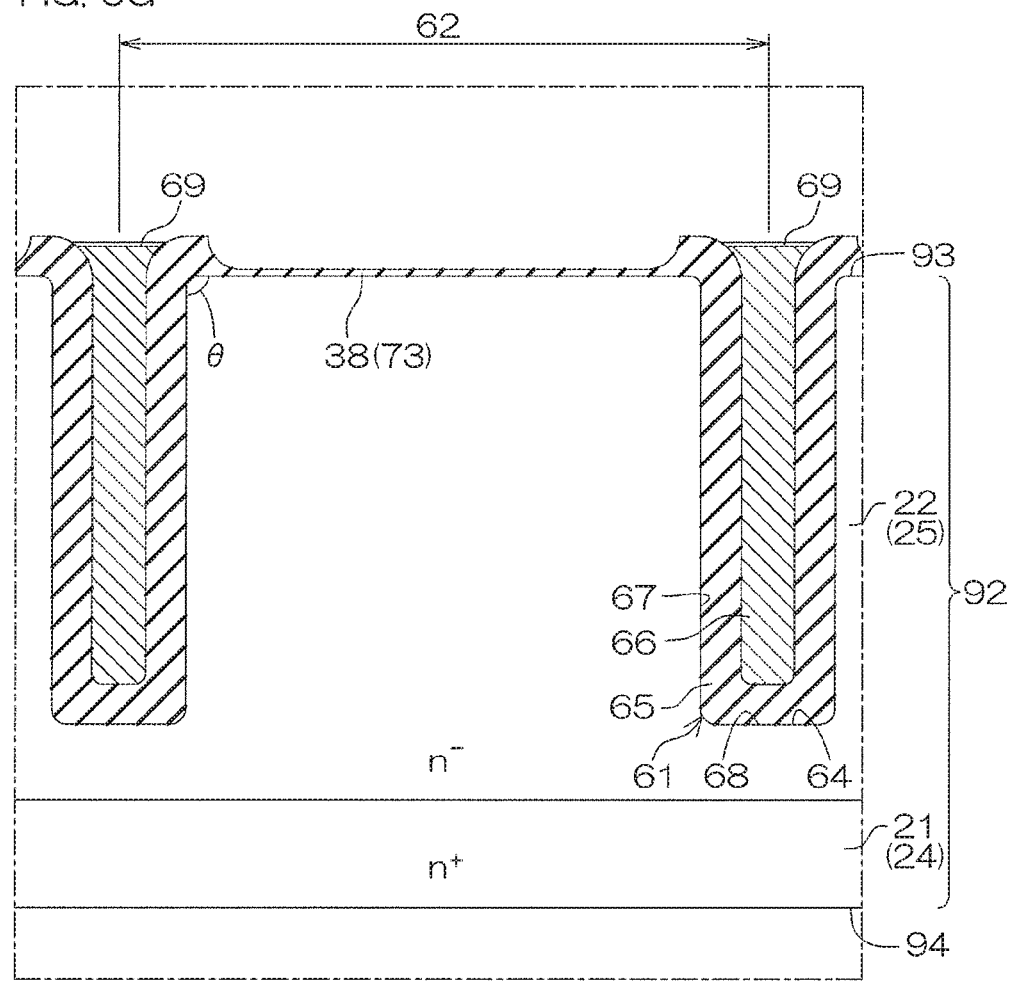

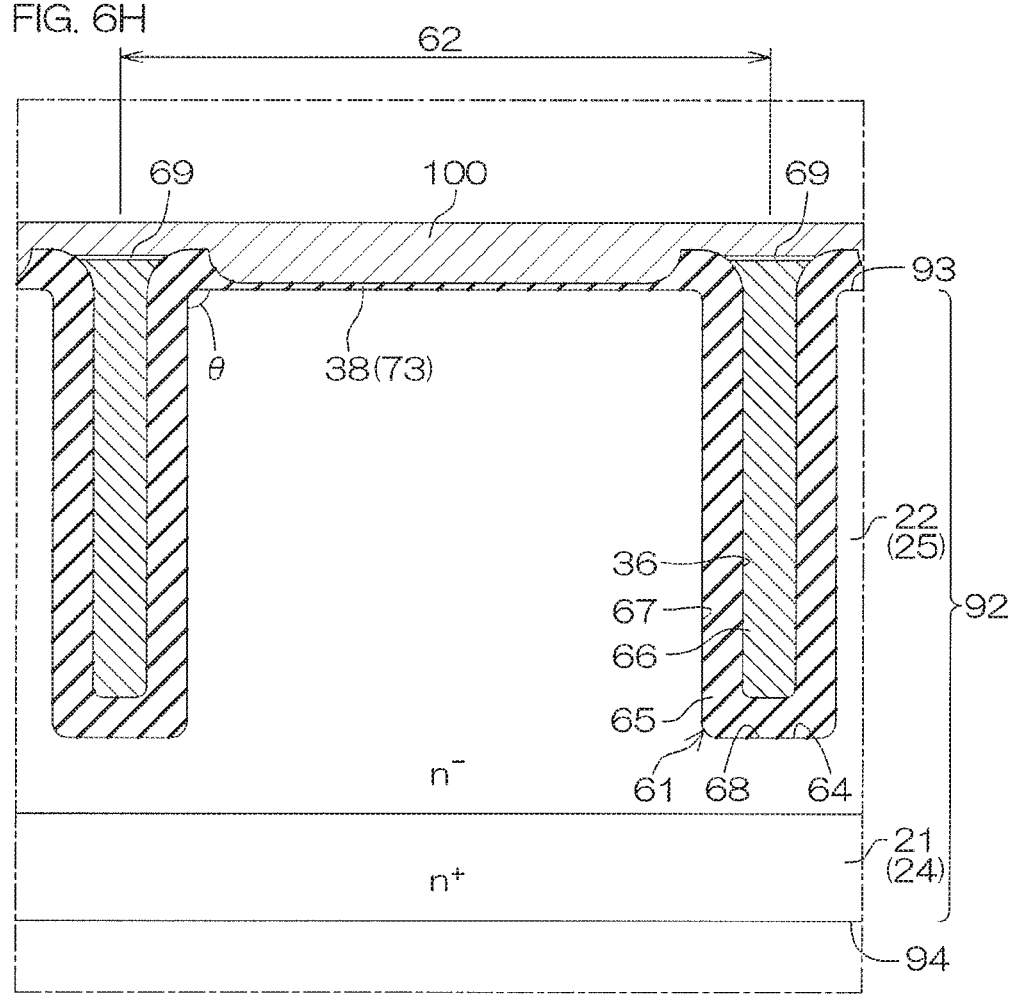

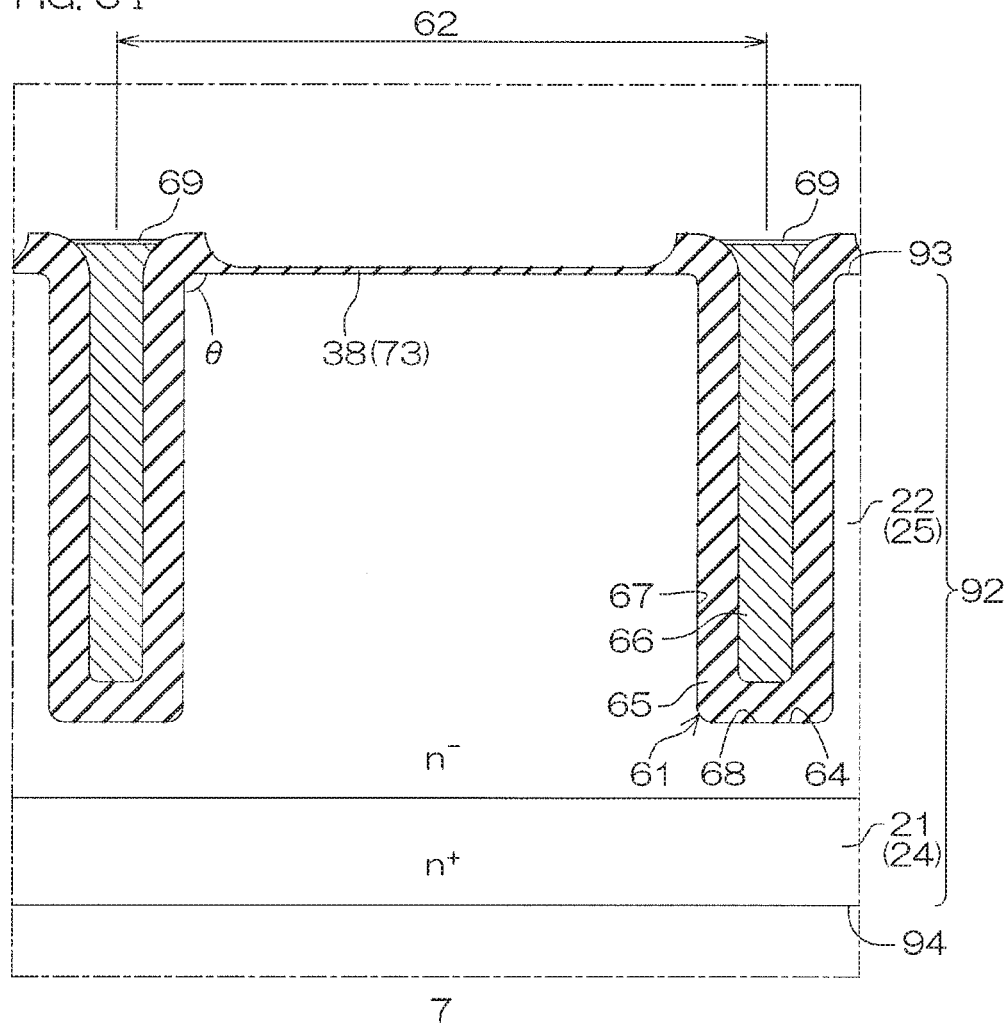

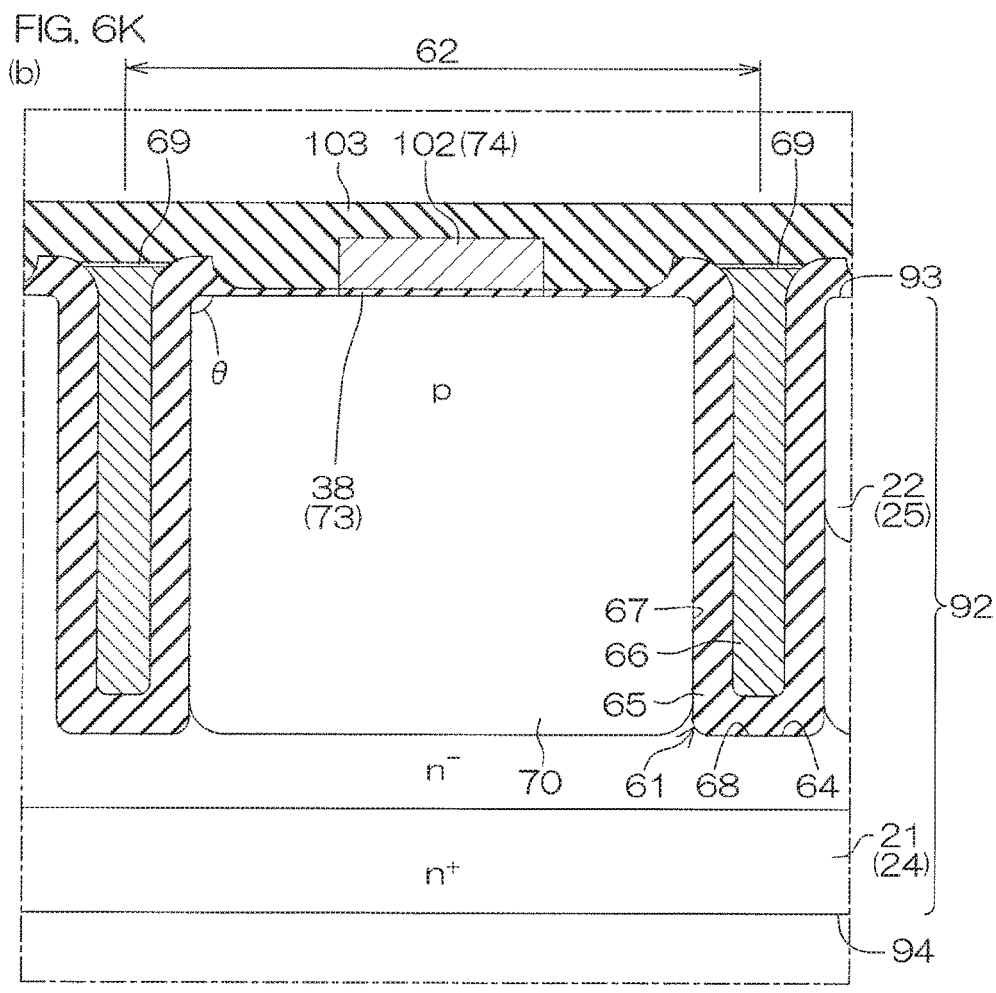

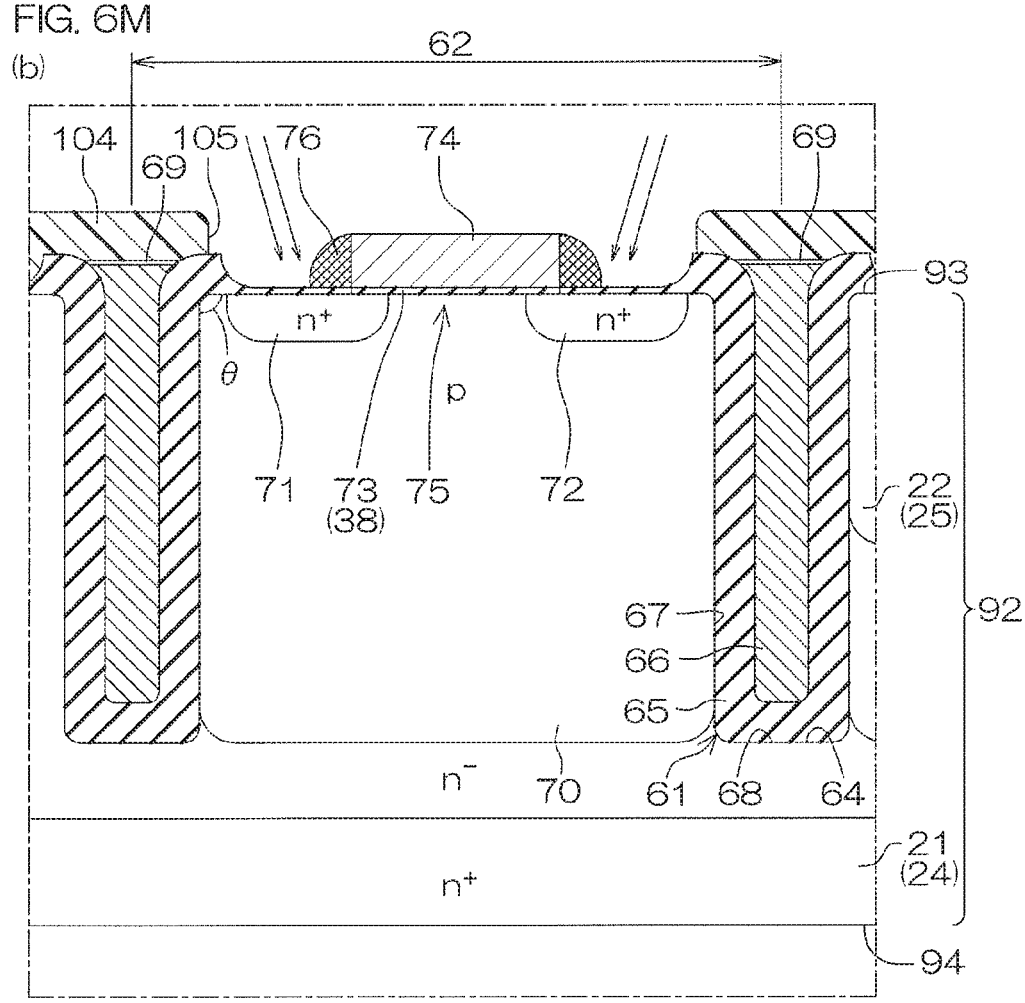

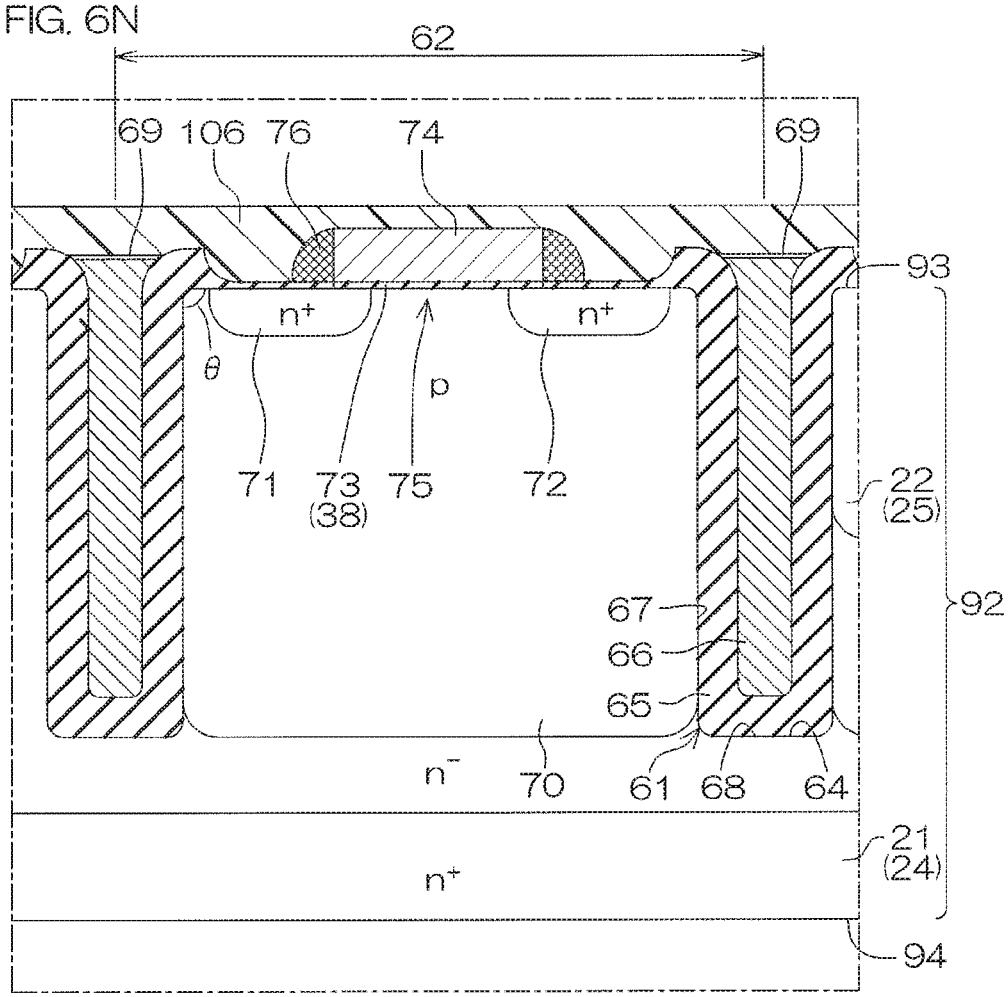

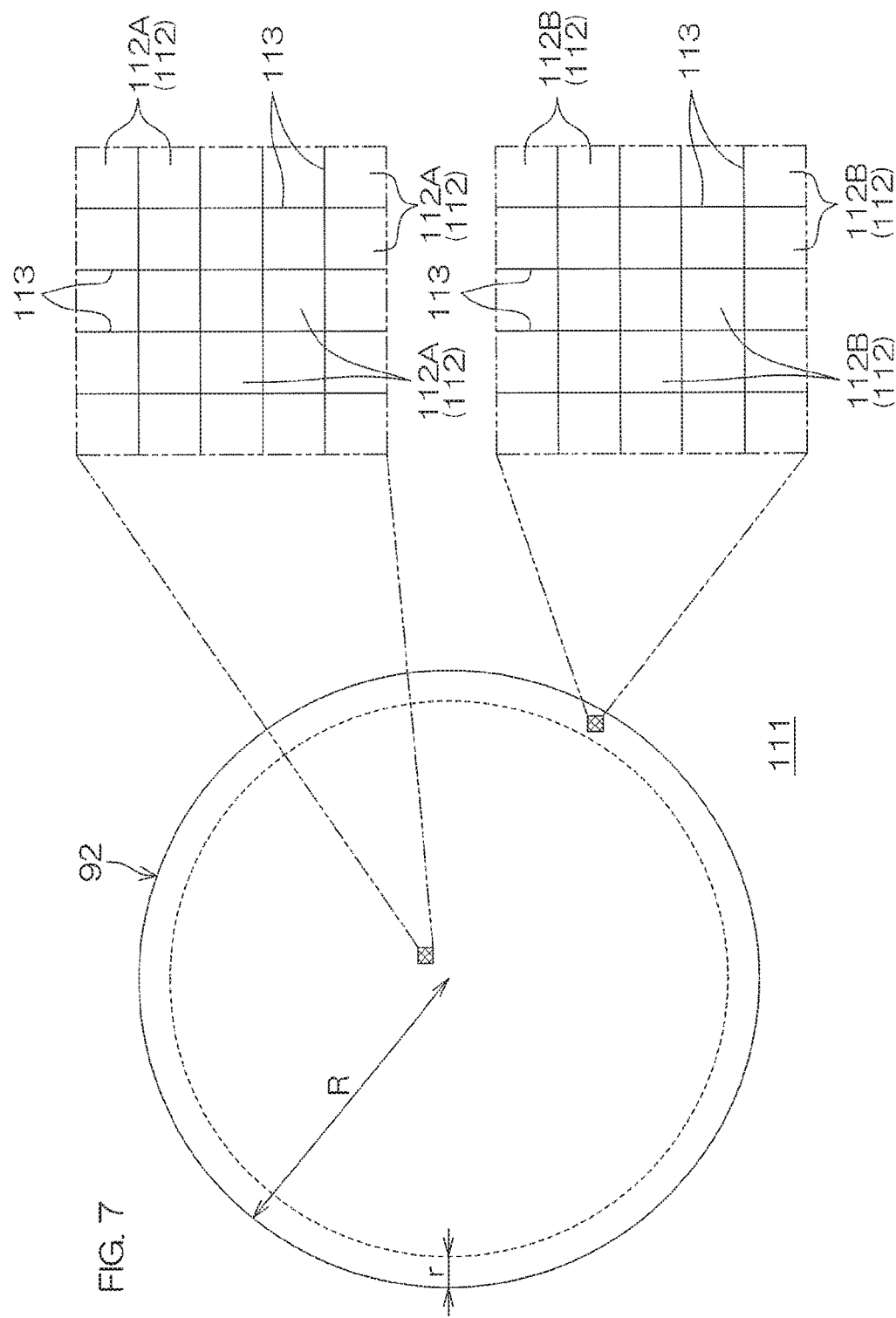

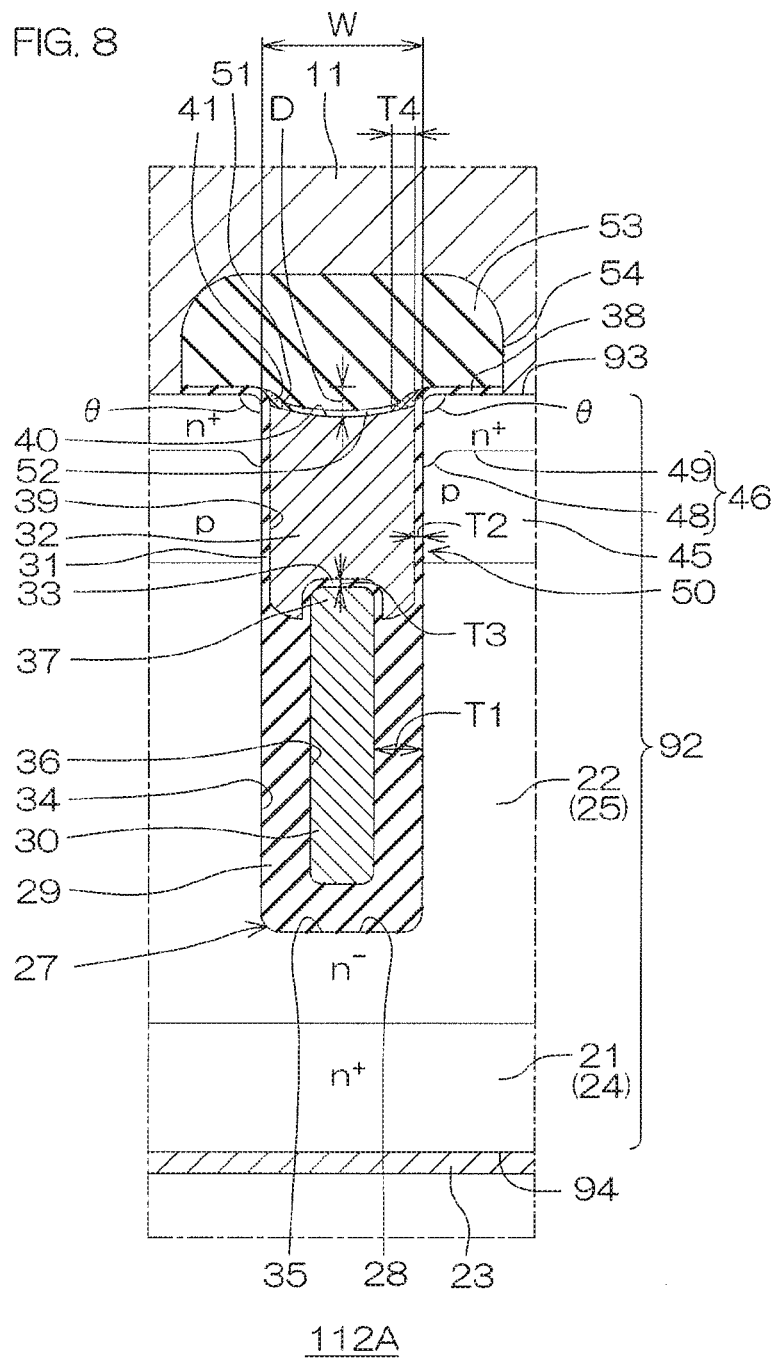

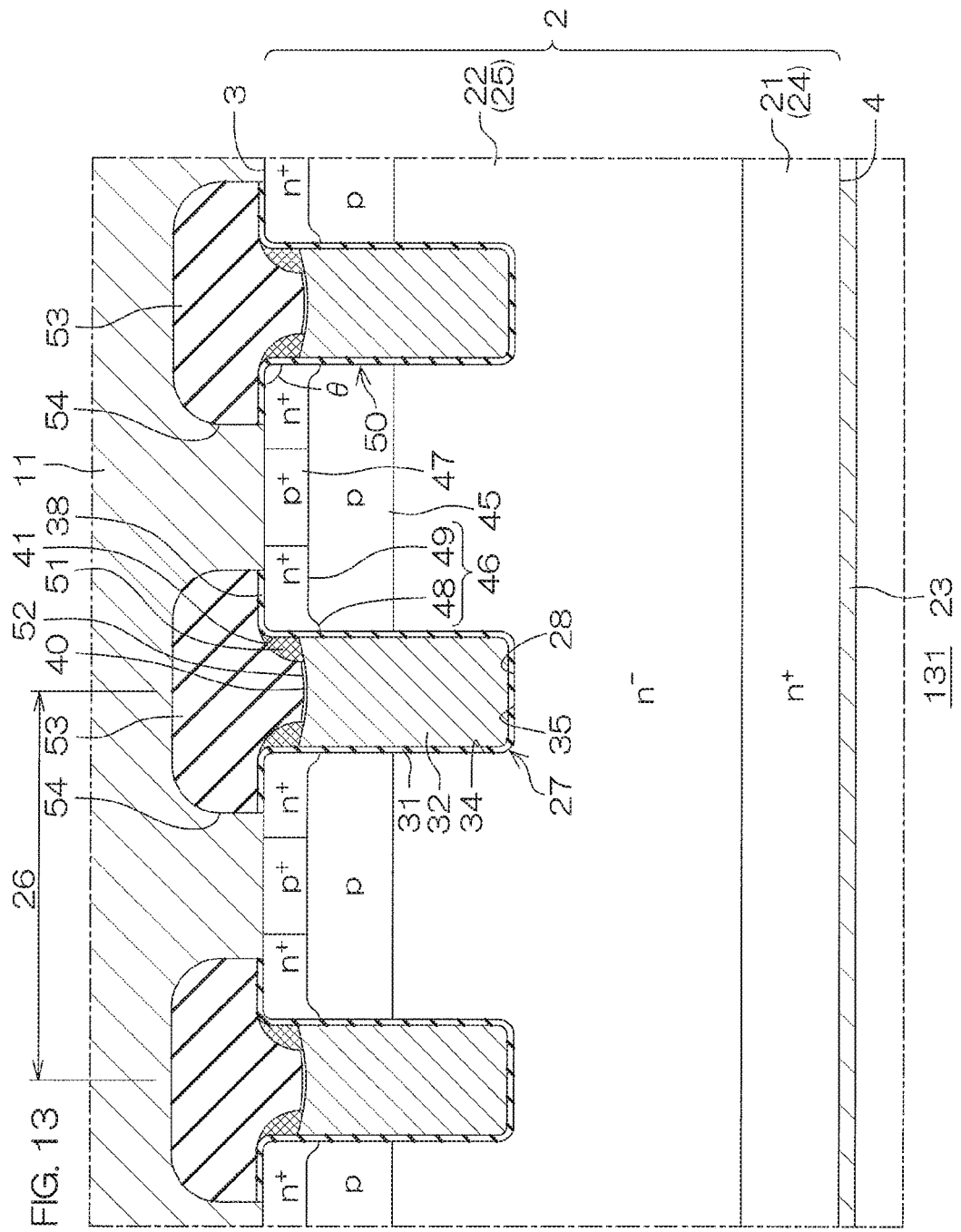

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Description of the Related Art

WO2012165329 discloses a power semiconductor device of a trench gate type. This power semiconductor device is manufactured through a step of forming a trench at a main surface of a semiconductor substrate, a step of forming a gate insulating film on an inner wall of the trench, a step of embedding a gate electrode into the trench with the gate insulating layer interposed therebetween, a step of forming a body region of a p-type in a surface layer portion of the semiconductor substrate, and a step of forming a source region of an $n^+$-type in a surface layer portion of the body region.

SUMMARY OF THE INVENTION

One preferred embodiment of the present invention provides a semiconductor device including a semiconductor layer of a first conductivity type having a main surface at which a trench is formed, a gate insulating layer formed along a side wall of the trench, a gate electrode embedded in the trench with the gate insulating layer interposed therebetween and having an upper surface located below the main surface of the semiconductor layer, a second conductivity type region formed in a surface layer portion of the main surface of the semiconductor layer and facing the gate electrode with the gate insulating layer interposed therebetween, a first conductivity type region formed in a surface layer portion of the second conductivity type region and facing the gate electrode with the gate insulating layer interposed therebetween, and a side wall insulating layer covering the side wall of the trench in a recessed portion defined by the side wall of the trench and the upper surface of the gate electrode.

One preferred embodiment of the present invention provides a manufacturing method of a semiconductor device including steps of forming a trench at a main surface of the semiconductor wafer of a first conductivity type, forming a gate insulating layer along a side wall of the trench, embedding a gate electrode into the trench such that an upper surface of the gate electrode is to be located below the main surface of the semiconductor wafer, forming a second conductivity type region along the side wall of the trench by introducing a second conductivity type impurity into the surface layer portion of the main surface of the semiconductor wafer in a side of the trench, forming a side wall insulating layer covering the side wall of the trench in a recessed portion defined by the side wall of the trench and the upper surface of the gate electrode, and forming a first conductivity type region along the side wall of the trench in a surface layer portion of the second conductivity type region by introducing a first conductivity type impurity into the surface layer portion of the second conductivity type region via the side wall insulating layer.

One preferred embodiment of the present invention provides a semiconductor wafer structure including a semiconductor wafer of a first conductivity type set a first device formation region in which a first semiconductor device is to be formed and a second device formation region in which a second semiconductor device is to be formed, and having a main surface at which trenches are formed in each of the first device formation region and the second device formation region, wherein the first device formation region and the second device formation region each include a gate insulating layer formed along a side wall of the trench, a gate electrode embedded in the trench with the gate insulating layer interposed therebetween and having an upper surface located below the main surface of the semiconductor wafer, a second conductivity type region formed in a surface layer portion of the main surface of the semiconductor layer and facing the gate electrode with the gate insulating layer interposed therebetween, and a first conductivity type region formed in a surface layer portion of the second conductivity type region and facing the gate electrode with the gate insulating layer interposed therebetween, wherein the upper surface of the gate electrode formed in the second device formation region is located below the upper surface of the gate electrode formed in the first device formation region, and the second device formation region includes a side wall insulating layer covering the side wall of the trench in a recessed portion defined by the side wall of the trench and the upper surface of the gate electrode.

These and other objects, features, and advantages of the present invention will become apparent from the following description of preferred embodiments with reference to the accompanying drawings.

BRIEF DESCRIPTION OF THE DRAWINGS

FIG. 7 is a schematic plan view showing a semiconductor wafer structure manufactured during manufacture of the semiconductor device.

FIG. 8 is a cross-sectional view of a trench gate structure formed in a first device formation region of the semiconductor wafer structure shown in FIG. 7.

FIG. 13 is a cross-sectional view of a portion corresponding to FIG. 2 and shows a semiconductor device according to a third preferred embodiment of the present invention.

DETAILED DESCRIPTION OF THE PREFERRED EMBODIMENTS

Figure 1:
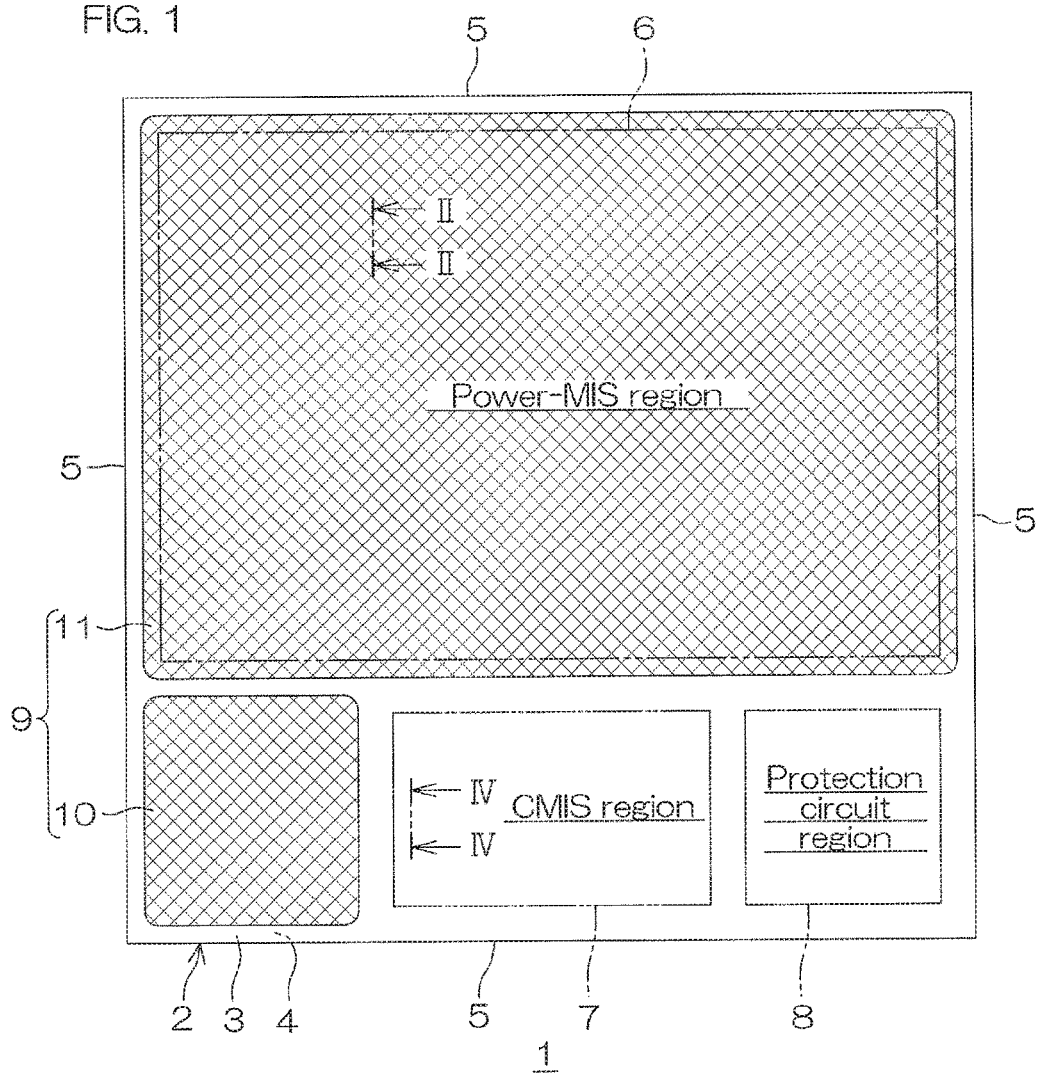
FIG. 1 is a schematic plan view showing a semiconductor device according to a first preferred embodiment of the present invention.

In a step of forming a gate electrode, the gate electrode is embedded into a trench such that an upper surface of the gate electrode is to be located below a main surface of a semiconductor layer to prevent a problem such as short circuit. However, in a case where the upper surface of the gate electrode is formed at a portion below a source region, a normal operation in the semiconductor device may be hindered since a channel is no longer formed in a body region.

In order to avoid such a problem, it can be considered that to form the source region facing the gate electrode with a gate insulating film interposed therebetween by introducing a first conductivity type impurity into the surface layer portion of a body region from a side wall of the trench.

However, in this case, a distance between a lower portion of the body region and a lower portion of the source region becomes shortened, so that a channel length of a channel formed in the body region decreases. In this case, problems such as an increase in a leakage current and a deterioration in a threshold voltage are caused, so that it is hard to obtain electrical characteristics according to a designed value.

Therefore, one preferred embodiment of the present invention provides a semiconductor device and a manufacturing method thereof capable of restraining a channel length from reduction, in a structure where a gate electrode is embedded in a trench.

One preferred embodiment of the present invention provides a semiconductor device including a semiconductor layer of a first conductivity type having a main surface at which a trench is formed, a gate insulating layer formed along a side wall of the trench, a gate electrode embedded in the trench with the gate insulating layer interposed therebetween and having an upper surface located below the main surface of the semiconductor layer, a second conductivity type region formed in a surface layer portion of the main surface of the semiconductor layer and facing the gate electrode with the gate insulating layer interposed therebetween, a first conductivity type region formed in a surface layer portion of the second conductivity type region and facing the gate electrode with the gate insulating layer interposed therebetween, and a side wall insulating layer covering the side wall of the trench in a recessed portion defined by the side wall of the trench and the upper surface of the gate electrode.

One preferred embodiment of the present invention provides a semiconductor wafer structure including a semiconductor wafer of a first conductivity type set a first device formation region in which a first semiconductor device is to be formed and a second device formation region in which a second semiconductor device is to be formed, and having a main surface at which trenches are formed in each of the first device formation region and the second device formation region, wherein the first device formation region and the second device formation region each include a gate insulating layer formed along a side wall of the trench, a gate electrode embedded in the trench with the gate insulating layer interposed therebetween and having an upper surface located below the main surface of the semiconductor wafer, a second conductivity type region formed in a surface layer portion of the main surface of the semiconductor layer and facing the gate electrode with the gate insulating layer interposed therebetween, and a first conductivity type region formed in a surface layer portion of the second conductivity type region and facing the gate electrode with the gate insulating layer interposed therebetween, wherein the upper surface of the gate electrode formed in the second device formation region is located below the upper surface of the gate electrode formed in the first device formation region, and the second device formation region includes a side wall insulating layer covering the side wall of the trench in a recessed portion defined by the side wall of the trench and the upper surface of the gate electrode.

One preferred embodiment of the present invention provides a manufacturing method of a semiconductor device including steps of forming a trench at a main surface of the semiconductor wafer of a first conductivity type, forming a gate insulating layer along a side wall of the trench, embedding a gate electrode into the trench such that an upper surface of the gate electrode is to be located below the main surface of the semiconductor wafer, forming a second conductivity type region along the side wall of the trench by introducing a second conductivity type impurity into the surface layer portion of the main surface of the semiconductor wafer in a side of the trench, forming a side wall insulating layer covering the side wall of the trench in a recessed portion defined by the side wall of the trench and the upper surface of the gate electrode, and forming a first conductivity type region along the side wall of the trench in a surface layer portion of the second conductivity type region by introducing a first conductivity type impurity into the surface layer portion of the second conductivity type region via the side wall insulating layer.

According to the manufacturing method of a semiconductor device, the side wall insulating layer covering the side wall of the trench is formed in the recessed portion defined by the side wall of the trench and the upper surface of the gate electrode. In the step of forming the first conductivity type region, the first conductivity type impurity is introduced into the surface layer portion of the second conductivity type region via the side wall insulating layer.

It is therefore suppressed that the first conductivity type impurity is introduced into a deep region of the surface layer portion of the second conductivity type region. Consequently, it can be suppressed that a distance between a lower portion of the second conductivity type region and a lower portion of the first conductivity type region is shortened, so that it is possible to suppress a channel length of a channel formed in the second conductivity type region from being shortened. As a result, it is possible to manufacture the semiconductor device and the semiconductor wafer structure having a structure capable of suppressing variation of the electrical characteristics such as the increase in a leakage current and a deterioration in a threshold voltage with respect to designed values.

For example, according to the semiconductor wafer structure having a structure where the first device formation region for the first semiconductor device and the second device formation region for the second semiconductor device are set, the upper surface of the gate electrode formed in the first device formation region and the upper surface of the gate electrode formed in the second device formation region may be formed in different depth positions due to a manufacturing error.

Hereafter, in the semiconductor wafer structure having a structure free from the side wall insulating layer, a case where the upper surface of the gate electrode formed in the second device formation region is formed below the upper surface of the gate electrode formed in the first device formation region shall be considered.

In this case, an ion implantable area of the second device formation region with respect to the main surface of the semiconductor wafer becomes larger than that of the first device formation region with respect to the main surface of the semiconductor wafer. This is because a distance between the main surface of the semiconductor wafer and the upper surface of the gate electrode formed in the second device formation region becomes larger than that in the first device formation region.

Therefore, in the second device formation region, there is a possibility that the first conductivity type impurity is introduced into a deeper region in the surface layer portion of the second conductivity type region than in the first device formation region. In such a structure, the channel length of the channel formed in the second conductivity type region of the second device formation region becomes short. As a result, a variation occurs between the electrical characteristics of the first semiconductor device obtainable from the first device formation region and the electrical characteristics of the second semiconductor device obtainable from the second device formation region.

Therefore, in the semiconductor wafer structure according to one preferred embodiment of the present invention, in the second device formation region having a structure where the upper surface of the gate electrode is formed below the upper surface of the gate electrode formed in the first device formation region, a structure including the side wall insulating layer covering the side wall of the trench is adopted. Consequently, in the second device formation region, it can be suppressed that the first conductivity type impurity is introduced into the deeper position of the surface layer portion of the second conductivity type region.

Therefore, it is possible to suppress the occurrence of variations between the channel length of the channel formed in the second conductivity type region of the first device formation region and the channel length of the channel formed in the second conductivity type region of the second device formation region.

As a result, it is possible to suppress the occurrence of variations between the electrical characteristics of the first semiconductor device obtainable from the first device formation region and the electrical characteristics of the second semiconductor device obtainable from the second device formation region. Therefore, the yield can be improved.

Hereinafter, preferred embodiments of the present invention will be described in detail with reference to the accompanying drawings.

FIG. 1 is a schematic plan view showing a semiconductor device 1 according to a first preferred embodiment of the present invention.

Referring to FIG. 1, the semiconductor device 1 includes a semiconductor layer 2. The semiconductor layer 2 includes a first main surface 3 on one side, a second main surface 4 on the other side, and a side surface 5 connecting the first main surface 3 and the second main surface 4. The semiconductor layer 2 is formed into a rectangular chip shape in a plan view as viewed from a normal direction of the first main surface 3 (Hereinafter simply referred to as "in the plan view").

The semiconductor device 1 has an intelligent power module (IPM) structure. A POWER-MIS region 6, a CMIS region 7 and a protection circuit region 8 are selectively set in the semiconductor layer 2.

The POWER-MIS region 6 may occupy equal to or greater than 20% and equal to or less than 80% (e.g. about 70%) of the first main surface 3 of the semiconductor layer 2 in the plan view. The CMIS region 7 and the protection circuit region 8 are selectively set at regions outside the POWER-MIS region 6. Each planer area and each planer shape of the POWER-MIS region 6, the CMIS region 7 and the protection circuit region 8 are arbitrary and are not limited to the form shown in FIG. 1.

The POWER-MIS region 6 includes a metal insulator semiconductor field effect transistor (MISFET) of a trench gate type. The CMIS region 7 includes a complementary metal insulator semiconductor field effect transistor (CMIS).

The protection circuit region 8 may include a current sensor circuit, a temperature sensor circuit, an over charge current detection (OCD) circuit, a thermal shut down (TSD) circuit, an under voltage lock out (UVLO) circuit, etc.

The current sensor circuit and the OCD circuit cooperate to protect the semiconductor device 1 from overcurrent. The temperature sensor circuit and the TSD circuit cooperate to protect the semiconductor device 1 from excessive temperature rise. The UVLO circuit prevents the semiconductor device 1 from malfunctioning when a voltage below a predetermined threshold voltage is applied to the semiconductor device 1.

A surface electrode 9 is formed at the first main surface 3 of the semiconductor layer 2. The surface electrode 9 may include at least one of titanium, nickel, gold, silver, copper, aluminum, an alloy including copper, or an alloy including aluminum. The surface electrode 9 may include an aluminum-copper alloy (an Al—Cu alloy) or an aluminum-silicon-copper alloy (an Al—Si—Cu alloy).

The surface electrode 9 includes a gate pad electrode 10 and a source pad electrode 11. The gate pad electrode 10 is formed at a region outside the POWER-MIS region 6, the CMIS region 7 and the protection circuit region 8 in the plan view.

The gate pad electrode 10 is formed along one corner portion connecting the two side surfaces 5 on the first main surface 3 of the semiconductor layer 2 in this preferred embodiment. The source pad electrode 11 covers the POWER-MIS region 6.

Figure 2:
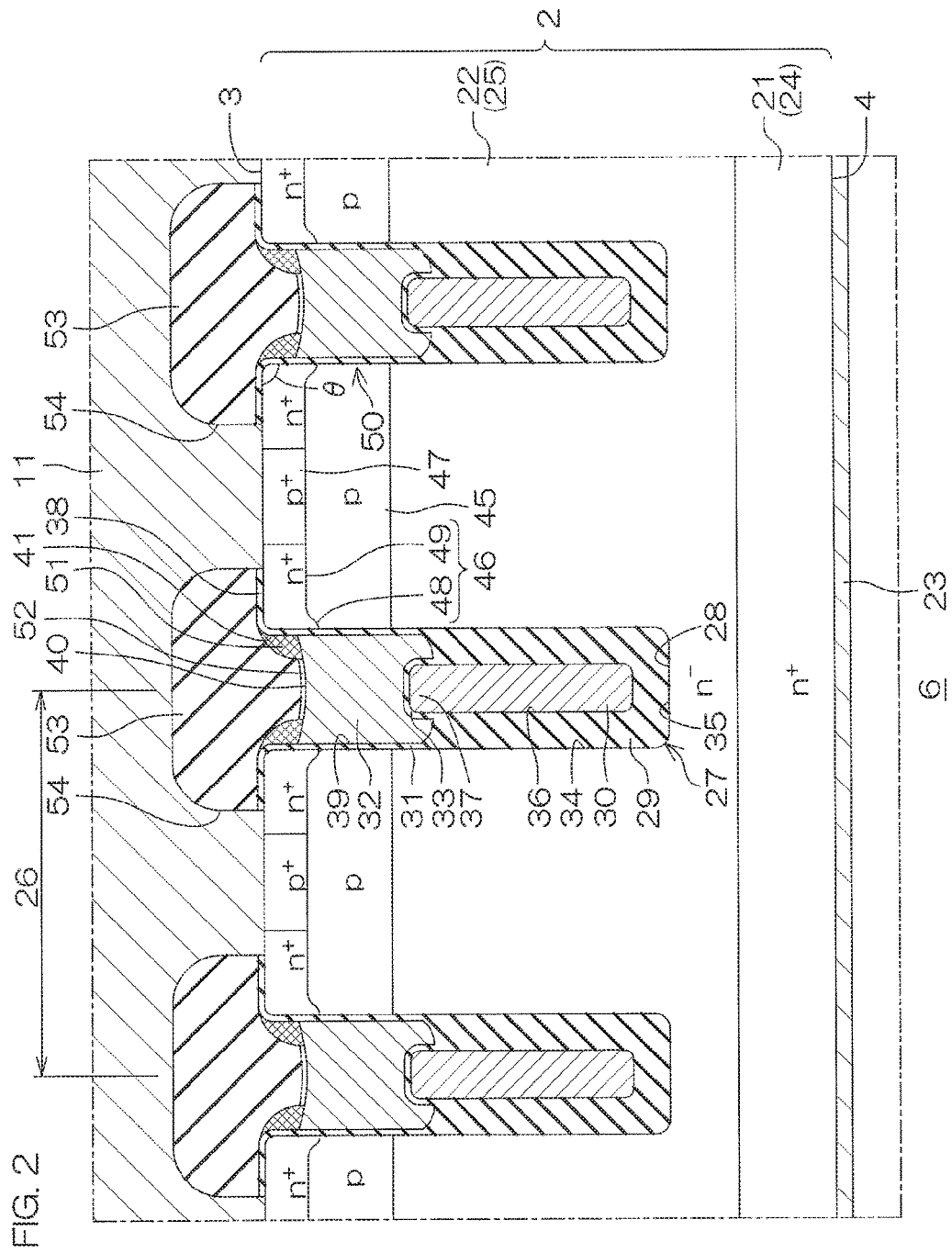
FIG. 2 is a cross-sectional view taken along II-II line shown in FIG. 1.
Figure 3:
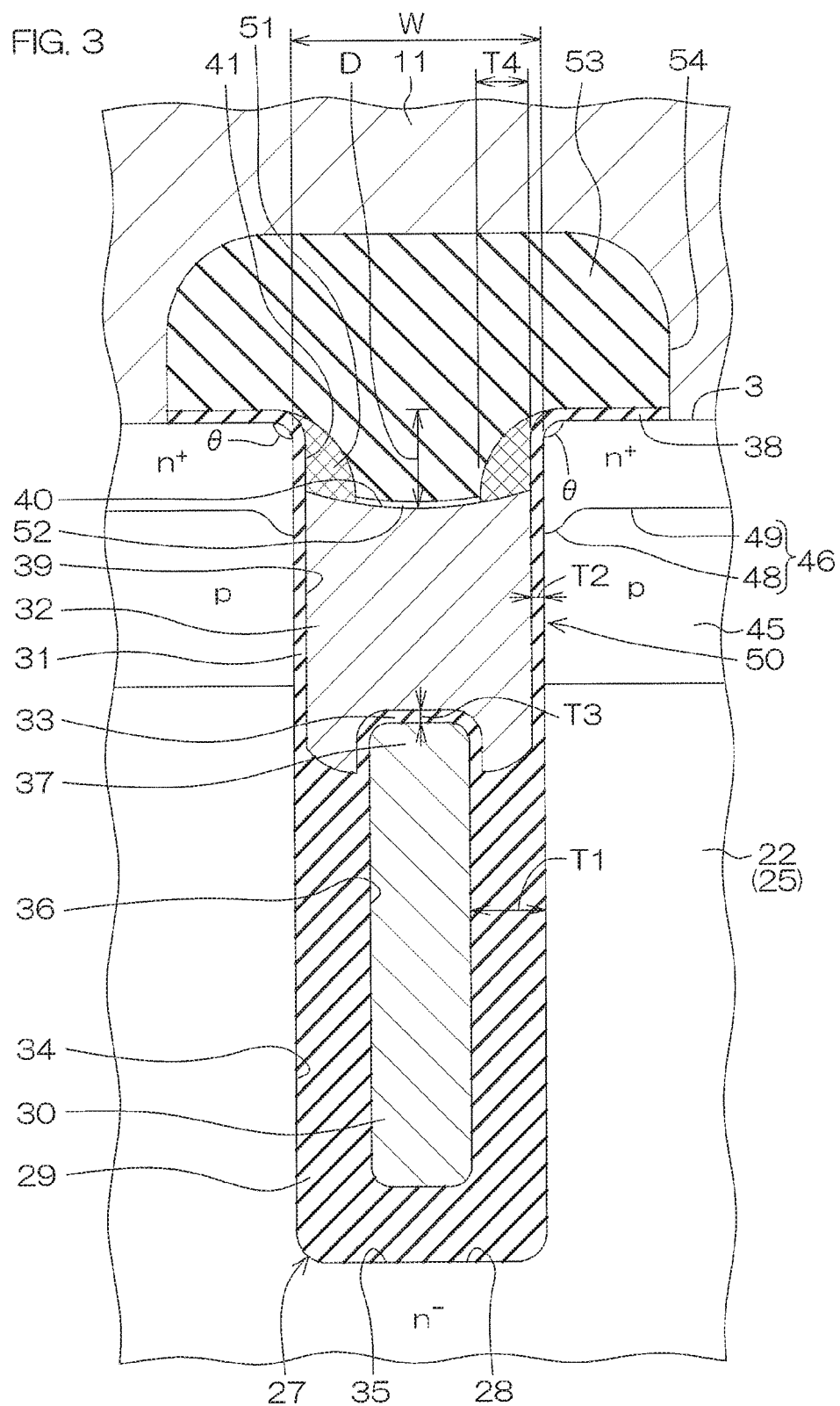
FIG. 3 is an enlarged view of a trench gate structure shown in FIG. 2.

Hereinafter, the specific structures of the POWER-MIS region 6 shall be described. FIG. 2 is a cross-sectional view taken along II-II line shown in FIG. 1. FIG. 3 is an enlarged view of a trench gate structure 27 shown in FIG. 2.

Referring to FIG. 2, the semiconductor layer 2 includes a semiconductor substrate 21 of $n^+$-type made of silicon and an epitaxial layer 22 of $n^-$-type made of silicon formed on the semiconductor substrate 21. The epitaxial layer 22 forms the first main surface 3 of the semiconductor layer 2. The semiconductor substrate 21 forms the second main surface 4 of the semiconductor layer 2.

A drain electrode 23 is connected to the second main surface 4 of the semiconductor layer 2 as a back electrode. Therefore, the semiconductor substrate 21 is formed as a drain region 24 of $n^+$-type. And the epitaxial layer 22 is formed as a drain drift region 25 of $n^-$-type. As the electrode material of the drain electrode 23, the same material as the electrode material of the surface electrode 9 may be applied.

Referring to FIG. 2 and FIG. 3, a trench gate structure 27 defining unit cells 26 of the MISFET is formed at a surface layer portion of the first main surface 3 of the semiconductor layer 2. The trench gate structure 27 may be formed in a stripe shape or a lattice shape in the plan view. The trench gate structure 27 is electrically connected to the gate pad electrode 10 in a region not shown.

The trench gate structure 27 includes a gate trench 28 formed in the first main surface 3 of the semiconductor layer 2. The trench gate structure 27 has a split gate structure in which two electrodes separated vertically from each other by an insulator in the gate trench 28.

The trench gate structure 27 includes an embedded electrode 30 embedded in a lower portion of the gate trench 28 with a lower insulating film 29 (a lower insulating layer) interposed therebetween. The trench gate structure 27 also includes a gate electrode 32 formed on the embedded electrode 30 with a gate insulating film 31 (a gate insulating layer) interposed between the gate trench 28 and the gate electrode 32 at an upper portion of the gate trench 28. The trench gate structure 27 also includes an intermediate insulating film 33 (an intermediate insulating layer) formed in a region between the embedded electrode 30 and the gate electrode 32.

The gate trench 28 includes a side wall 34 and a bottom wall 35. The depth of the gate trench 28 may be equal to or greater than 1 μm and equal to or smaller than 10 μm (e.g. about 4 μm).

The gate trench 28 may be formed in a tapered shape in which an opening area is larger than an area of the bottom wall 35. An absolute value of an angle θ between the first main surface 3 of the semiconductor layer 2 and the side wall 34 of the gate trench 28 in the semiconductor layer 2 may be equal to or greater than 90° and equal to or less than 95° (e.g. about 91°).

The lower insulating film 29 is formed in the lower portion of the gate trench 28 along the side wall 34 and the bottom wall 35 of the gate trench 28. The embedded electrode 30 is embedded in a wall shape extending vertically in a lower recessed portion 36 defined by the lower insulating film 29.

The embedded electrode 30 has a protrusion portion 37 protruding above an upper end portion of the lower insulating film 29 (protruding a side of the first main surface 3 of the semiconductor layer 2). The intermediate insulating film 33 covers the protrusion portion 37 of the embedded electrode 30.

The gate insulating film 31 is formed along the side wall 34 of the gate trench 28 at the upper portion of the gate trench 28. An upper end portion of the gate insulating film 31 is integrated with a surface insulating film 38 formed on the first main surface 3 of the semiconductor layer 2. A lower end portion of the gate insulating film 31 is integrated with the upper end portion of the lower insulating film 29.

Recesses are defined by the intermediate insulating film 33, the lower insulating film 29 and the gate insulating film 31 at both sides of the protrusion portion 37 of the embedded electrode 30. An upper recessed portion 39 formed in a reverse concave shape is defined at an opening side of the gate trench 28.

The gate electrode 32 is embedded in the upper recessed portion 39. The gate electrode 32 has an upper surface 40 located below the first main surface 3 of the semiconductor layer 2. The upper surface 40 of the gate electrode 32 has a curved surface concavely curved toward the bottom wall 35 of the gate trench 28. The gate electrode 32 having the upper surface 40 substantially parallel to the first main surface 3 of the semiconductor layer 2 may be formed.

A recessed portion 41 is defined by the upper surface 40 of the gate electrode 32 and the side wall 34 of the gate trench 28 at a side of the opening of the gate trench 28. Referring to FIG. 3, a depth D of the recessed portion 41 along the thickness direction of the semiconductor layer 2 may be equal to or greater than 1000 Å and equal to or less than 6000 Å.

The embedded electrode 30 and the gate electrode 32 each include polysilicon having excellent embedding property. In one form, a gate voltage may be applied to the embedded electrode 30 and the gate electrode 32. According to this structure, since on-resistance of the semiconductor layer 2 can be reduced, an increase in power consumption can be suppressed.

In the other form, a gate voltage may be applied to the gate electrode 32 whereas a reference voltage (e.g. a source voltage) may be applied to the embedded electrode 30. In the other form, the embedded electrode 30 may be formed as a field plate electrode. According to this structure, since a parasitic capacitance between the semiconductor layer 2 and the embedded electrode 30 can be reduced, a reduction in switching speed can be suppressed.

The lower insulating film 29, the gate insulating film 31, the intermediate insulating film 33 and the surface insulating film 38 may include the same insulating material. The lower insulating film 29, the gate insulating film 31, the intermediate insulating film 33 and the surface insulating film 38 may include different insulating materials from each other.

The lower insulating film 29, the gate insulating film 31, the intermediate insulating film 33 and the surface insulating film 38 include at least one of $SiO_2$, AlO, TaO, TiO, AlN, AlSiN, TiN, SiN, NiO, WO, BN, CrN or SiON. As typical insulating materials of the lower insulating film 29, the gate insulating film 31, the intermediate insulating film 33 and the surface insulating film 38, $SiO_2$ and SiN can be exemplified.

Referring to FIG. 3, a thickness T1 of the lower insulating film 29 is larger than a thickness T2 of the gate insulating film 31 (T1>T2). A thickness T3 of the intermediate insulating film 33 is smaller than the thickness T1 of the lower insulating film 29 (T1>T3).

The thickness T3 of the intermediate insulating film 33 may be equal to or greater than the thickness T2 of the gate insulating film 31. The thickness T3 of the intermediate insulating film 33 may be equal to or less than the thickness T2 of the gate insulating film 31. The thickness T3 of the intermediate insulating film 33 may be equal to the thickness T2 of the gate insulating film 31.

A ratio T1/W of the thickness T1 of the lower insulating film 29 with respect to a width W of the gate trench 28 in the sectional view of FIG. 3 may be equal to or greater than 0.125 and equal to or smaller than 0.5. A ratio T2/W of the thickness T2 of the gate insulating film 31 with respect to the width W of the gate trench 28 may be equal to or greater than 0.01 and equal to or smaller than 0.10.

A ratio T3/W of the thickness T3 of the intermediate insulating film 33 with respect to the width W of the gate trench 28 may be equal to or greater than 0.01 and equal to or smaller than 0.10. The width W of the gate trench 28 may be equal to or greater than 0.8 μm and equal to or smaller than 2 μm (e.g. about 1.2 μm).

Each of the unit cell 26 of the MISFET includes a body region 45 (a second conductivity type region) of p-type, a source region 46 (a first conductivity type region) of $n^+$-type and a contact region 47 of $p^+$-type.

The body region 45 is formed along the side wall 34 of the gate trench 28 in the surface layer portion of the first main surface 3 of the semiconductor layer 2. The body region 45 faces the gate electrode 32 with the gate insulating film 31 interposed therebetween. The body region 45 is shared by the trench gate structures 27 adjacent to each other in the cross-sectional view.

The source region 46 is formed along the side wall 34 of the gate trench 28 in a surface layer portion of the body region 45. The source region 46 faces the gate electrode 32 with the gate insulating film 31 interposed therebetween. The source region 46 includes a first portion 48 in contact with the side wall 34 of the gate trench 28 and a second portion 49 which is an area other than the first portion 48.

The second portion 49 is formed integrally with the first portion 48. The second portion 49 extends to a side opposite the gate trench 28 along the first main surface 3 of the semiconductor layer 2 from the first portion 48. Regarding the thickness direction of the semiconductor layer 2, a lower portion of the first portion 48 of the source region 46 is located below a lower portion of the second portion 49 of the source region 46.

In one form, both the lower portion of the first portion 48 and the lower portion of the second portion 49 may be located below the upper surface 40 of the gate electrode 32. In the other form, the lower portion of the first portion 48 may be located below the upper surface 40 of the gate electrode 32 whereas the lower portion of the second portion 49 may be located above the upper surface 40 of the gate electrode 32.

The contact region 47 is formed in the surface layer portion of the body region 45. The contact region 47 penetrates the source region 46 and is electrically connected to the body region 45. The contact region 47 is formed at a distance from the side wall 34 of the gate trench 28 as shown in FIG. 2.

The contact region 47 may be free from contact with the side wall 34 of the gate trench 28. The contact region 47 in contact with the side wall 34 of the gate trench 28 may be formed in an arbitrary region (not shown) of the surface layer portion of the body region 45.

The source region 46, the body region 45 and the epitaxial layer 22 may be formed in that order from the first main surface 3 to the second main surface 4 of the semiconductor layer 2 at a side of the trench gate structure 27 where the contact region 47 does not exist.

The contact region 47, the body region 45 and the epitaxial layer 22 may be formed in that order from the first main surface 3 to the second main surface 4 of the semiconductor layer 2 at a side of the trench gate structure 27 where the contact region 47 exists.

A region between the source region 46 and the epitaxial layer 22 in the body region 45 is a channel 50 of the MISFET. A channel length of the channel 50 is defined as a distance along the thickness direction of the semiconductor layer 2 between the lower portion of the source region 46 and the lower portion of the body region 45.

Referring to FIG. 2 and FIG. 3, a side wall insulating layer 51 is formed in a recessed portion 41 defined by the upper surface 40 of the gate electrode 32 and the side wall 34 of the gate trench 28 at the opening side of the gate trench 28. In FIG. 2 and FIG. 3, for clarity, the side wall insulating layer 51 is shown by a cross hatching.

The side wall insulating layer 51 covers the side wall 34 of the gate trench 28 with the gate insulating film 31 interposed therebetween and covers the upper surface 40 of the gate electrode 32 in the recessed portion 41. The side wall insulating layer 51 covers an edge portion of the upper surface 40 of the gate electrode 32 so as to expose a center portion of the upper surface 40 of the gate electrode 32. The side wall insulating layer 51 is formed along a corner portion defined by the side wall 34 of the gate trench 28 and the upper surface 40 of the gate electrode 32.

The side wall insulating layer 51 protrudes from the side wall 34 of the gate trench 28 towards the upper surface 40 of the gate electrode 32. The side wall insulating layer 51 has a curved surface convexly curved toward the inside the recessed portion 41.

The side wall insulating layer 51 hardly erodes the gate electrode 32, so that the upper surface 40 of the gate electrode 32 extends continuously and smoothly from the center portion to the edge portion. Accordingly, the upper surface 40 of the gate electrode 32 forms the concave curved surface that increases almost monotonically from the center portion to the edge portion in this preferred embodiment.

The side wall insulating layer 51 may cover an opening edge portion of the gate trench 28 connecting the first main surface 3 of the semiconductor layer 2 and the side wall 34 of the gate trench 28. The side wall insulating layer 51 may expose the opening edge portion of the gate trench 28.

The side wall insulating layer 51 faces the source region 46 with the gate insulating film 31 interposed therebetween in a portion where the contact region 47 does not exist. Regarding the thickness direction of the semiconductor layer 2, the entire area of the side wall insulating layer 51 faces the first portion 48 of the source region 46.

The side wall insulating layer 51 may face the contact region 47 with the gate insulating film 31 interposed therebetween in a portion where the contact region 47 exists. Regarding the thickness direction of the semiconductor layer 2, the entire area of the side wall insulating layer 51 may face the contact region 47.

A ratio T4/W of a thickness T4 of the side wall insulating layer 51 with respect to the width W of the gate trench 28 may be equal to or greater than 0.01 and equal to or less than 0.2 although the ratio T4/W can be varied according to the depth D of the recessed portion 41.

In one form, the side wall insulating layer 51 may include the same insulating material as the gate insulating film 31. In this structure, the side wall insulating layer 51 may be integrated with the gate insulating film 31. In this case, a boundary region between the side wall insulating layer 51 and the gate insulating film 31 may disappear, and the side wall insulating layer 51 and the gate insulating film 31 may be formed in a state to be regarded as a single layer structure.

In the other form, the side wall insulating layer 51 may include an insulating material different from that of the gate insulating film 31. In this structure, a boundary region between the side wall insulating layer 51 and the gate insulating film 31 may not disappear, and the side wall insulating layer 51 and the gate insulating film 31 may be formed in a state to be regarded as a laminated structure.

The side wall insulating layer 51 may include at least one of $SiO_2$, AlO, TaO, TiO, AlN, AlSiN, TiN, SiN, NiO, WO, BN, CrN or SiON. As typical insulating materials of the side wall insulating layer 51, $SiO_2$ and SiN can be exemplified.

Referring to FIG. 2 and FIG. 3, at a portion of the upper surface 40 of the gate electrode 32 exposed from the side wall insulating layer 51, an insulating film 52 having a small (thin) thickness is formed. The upper insulating film 52 may include an oxide film. The oxide film may include a natural oxide film, a thermal oxide film, or the like. The oxide film may include a silicon oxide film.

Referring to FIG. 2, an interlayer insulating layer 53 is formed on the first main surface 3 of the semiconductor layer 2. The interlayer insulating layer 53 is entered into the recessed portion 41 of the gate trench 28 from above the semiconductor layer 2. More specifically, the interlayer insulating layer 53 includes an anchor portion entered into a recessed portion defined by the upper insulating film 52 and the side wall insulating layer 51 in the recessed portion 41.

The interlayer insulating layer 53 may have a single layer structure composed of a single insulating film. The interlayer insulating layer 53 may have a laminated structure in which a plurality of insulating films is laminated. The interlayer insulating layer 53 may include at least one of $SiO_2$ or SiN.

A plurality of contact holes 54 exposing the source region 46 and the contact region 47 is formed in the interlayer insulating layer 53. The source pad electrode 11 is entered into the contact holes 54 from above the interlayer insulating layer 53. The source pad electrode 11 is electrically connected to the source region 46 and the contact region 47 in the contact holes 54.

Figure 4:
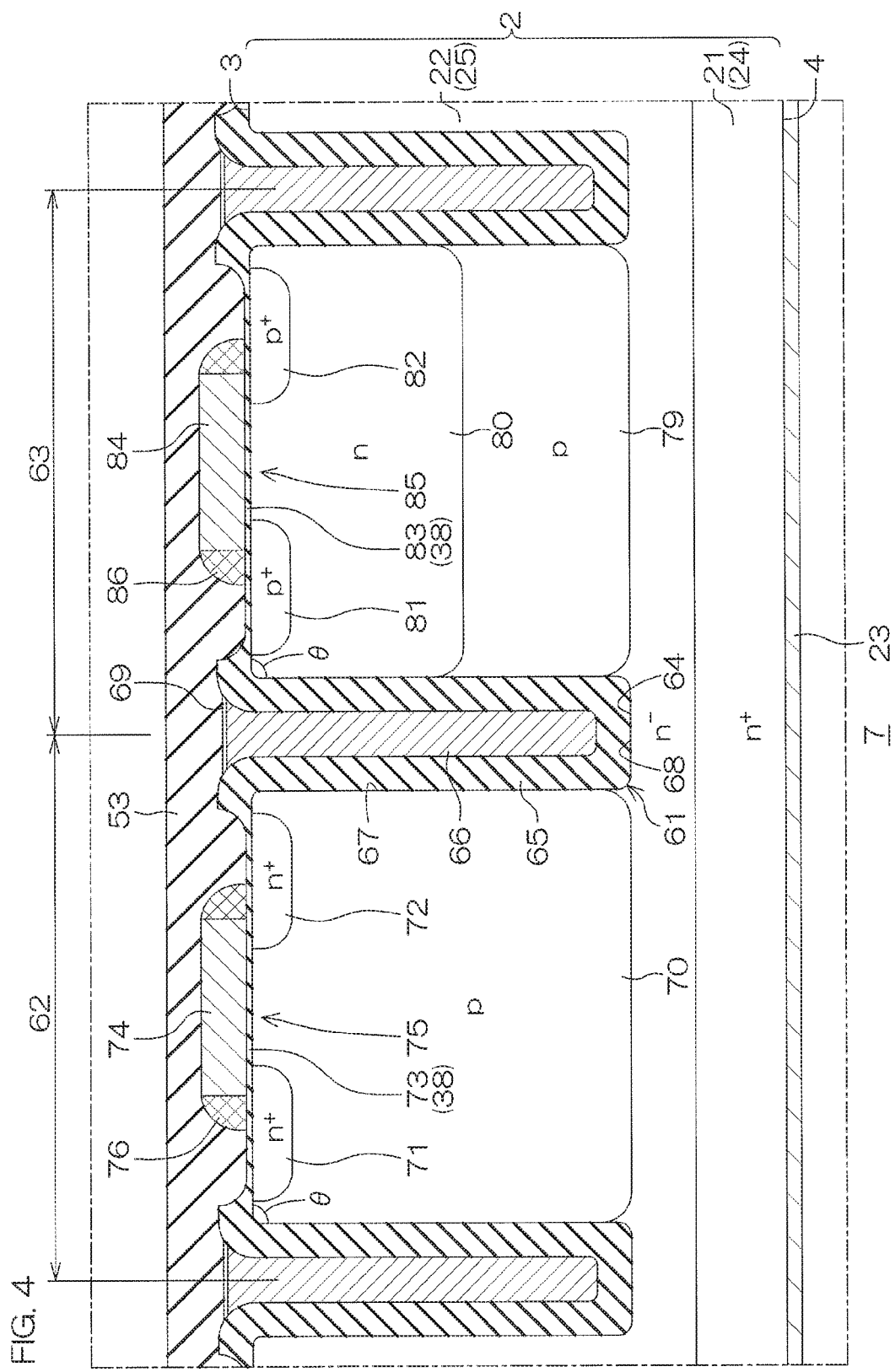
FIG. 4 is a cross-sectional view taken along IV-IV line shown in FIG. 1.

Next, the concrete structure of the CMIS region 7 shall be described. FIG. 4 is a cross-sectional view taken along IV-IV line shown in FIG. 1.

Referring to FIG. 4, the CMIS region 7 includes a device separation structure 61, an n-MIS region 62 and a p-MIS region 63. The n-MIS region 62 and the p-MIS region are electrically separated from each other by the device separation structure 61. The device separation structure 61 includes a device separation trench 64, a device separation insulating film 65 and a device separation electrode 66.

The device separation trench 64 includes a side wall 67 and a bottom wall 68. The device separation trench 64 may be formed in a tapered shape in a sectional view where an opening area is larger than an area of the bottom wall 68. An absolute value of an angle θ between the first main surface 3 of the semiconductor layer 2 and the side wall 67 of the device separation trench 64 in the semiconductor layer 2 may be equal to or greater than 90° and equal to or less than 95° (e.g. about 91°).

The device separation trench 64 may have a width and a depth substantially equal to the width W and the depth of the gate trench 28. The device separation trench 64 may be formed in a different width and a different depth from the width W and the depth of the gate trench 28.

The device separation insulating film 65 is formed along the side wall 67 and the bottom wall 68 of the device separation trench 64. The device separation insulating film 65A defines a recessed space in the device separation trench 64.

A part of the device separation insulating film 65 is exposed from the device separation trench 64 and is connected to the surface insulating film 38 on the first main surface 3 of the semiconductor layer 2. The device separation insulating film 65 has a thickness greater than the thickness of the surface insulating film 38. The device separation insulating film 65 may have a thickness substantially equal to the thickness T1 of the lower insulating film 29.

The device separation electrode 66 is embedded in the recessed space defined by the device separation insulating film 65. An upper surface of the device separation electrode 66 may be formed above the first main surface 3 of the semiconductor layer 2. The upper surface of the device separation electrode 66 may be formed above the upper surface 40 of the gate electrode 32. A reference voltage (e.g. a source voltage) may be applied to the device separation electrode 66.

An upper insulating film 69 having a small (thin) thickness may be formed on the upper surface of the device separation electrode 66. The upper insulating film 69 may include an oxide film. The oxide film may include a natural oxide film, a thermal oxide film, or the like. The oxide film may be a silicon oxide film.

A p-type well region 70 is formed in the surface layer portion of the first main surface 3 of the semiconductor layer 2 in the n-MIS region 62. The p-type well region 70 has a depth substantially equal to the depth of the device separation trench 64 in this preferred embodiment. The p-type well region 70 shallower or deeper than the depth of the device separation trench 64 may be formed.

An $n^+$-type source region 71 and an $n^+$-type drain region 72 are formed in a surface layer portion of the p-type well region 70 at intervals each other. The $n^+$-type source region 71 and the $n^+$-type drain region 72 may have an equal depth and an equal n-type impurity concentration.

An n-MIS gate electrode 74 is formed on the first main surface 3 of the semiconductor layer 2 with an n-MIS gate insulating film 73 interposed therebetween in the n-MIS region 62. The n-MIS gate insulating film 73 is formed using the surface insulating film 38 in this preferred embodiment. The n-MIS gate insulating film 73 having a thickness larger or smaller than the thickness of the surface insulating film 38 may be formed.

The n-MIS gate electrode 74 faces a region between the $n^+$-type source region 71 and the $n^+$-type drain region 72 in the p-type well region 70 with the n-MIS gate insulating film 73 interposed therebetween. The n-MIS gate electrode 74 also faces a part of the $n^+$-type source region 71 and a part of the $n^+$-type drain region 72 with the n-MIS gate insulating film 73 interposed therebetween.

In the surface layer portion of the p-type well region 70, a region between the $n^+$-type source region 71 and the $n^+$-type drain region 72 is a channel 75 of the n-MIS region 62.

A side wall of the n-MIS gate electrode 74 is covered with a first side wall 76. The first side wall 76 protrudes outward from the side wall of the n-MIS gate electrode 74 along the first main surface 3 of the semiconductor layer 2.

The first side wall 76 has a curved surface convexly curved towards the outside of the n-MIS gate electrode 74. The first side wall 76 may include the same insulating material as the side wall insulating layer 51.

In the p-MIS region 63, a p-type well region 79 is formed in the surface layer portion of the first main surface 3 of the semiconductor layer 2. The p-type well region 79 has a depth substantially equal to the depth of the device separation trench 64 in this preferred embodiment. The p-type well region 79 shallower or deeper than the depth of the device separation trench 64 may be formed.

An n-type well region 80 is formed in a surface layer portion of the p-type well region 79. The n-type well region 80 is formed in a region shallower than the p-type well region 79 in the semiconductor layer 2. The n-type well region 80 is therefore formed at a distance from a lower portion of the p-type well region 79 to the first main surface 3 side of the semiconductor layer 2.

A $p^+$-type source region 81 and a $p^+$-type drain region 82 are formed in a surface layer portion of the n-type well region 80 at intervals each other. The $p^+$-type source region 81 and the $p^+$-type drain region 82 may have an equal depth and an equal p-type impurity concentration.

A p-MIS gate electrode 84 is formed on the first main surface 3 of the semiconductor layer 2 with a p-MIS gate insulating film 83 interposed therebetween in the p-MIS region 63. The p-MIS gate insulating film 83 is formed using the surface insulating film 38 in this preferred embodiment.

The p-MIS gate insulating film 83 having a thickness larger or smaller than the thickness of the surface insulating film 38 may be formed.

The p-MIS gate electrode 84 faces a region between the p$^+$-type source region 81 and the p$^+$-type drain region 82 in the n-type well region 80 with the p-MIS gate insulating film 83 interposed therebetween. The p-MIS gate electrode 84 also faces a part of the p$^+$-type source region 81 and a part of the p$^+$-type drain region 82 with the p-MIS gate insulating film 83 interposed therebetween.

A region between the p$^+$-type source region 81 and the p$^+$-type drain region 82 in the surface layer portion of the n-type well region 80 is a channel 85 of the p-MIS region 63.

A side wall of the p-MIS gate electrode 84 is covered with a second side wall 86. The second side wall 86 protrudes outward from the side wall of the p-MIS gate electrode 84 along the first main surface 3 of the semiconductor layer 2. The second side wall 86 has a curved surface convexly curved towards the outside of the p-MIS gate electrode 84. The second side wall 86 may include the same insulating material as the side wall insulating layer 51.

Figure 5A:
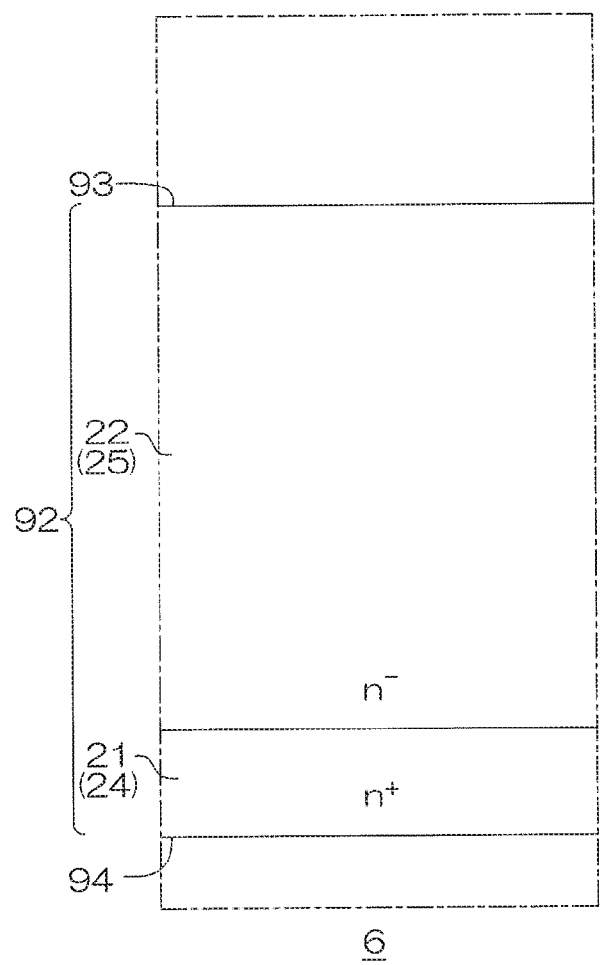
FIG. 5A to FIG. 5O are cross-sectional views showing a manufacturing method of the semiconductor device shown in FIG. 1 and showing a part of a POWER-MIS region.

FIG. 5A to FIG. 5O and FIG. 6A to FIG. 6O are sectional views showing a manufacturing method of the semiconductor device 1 shown in FIG. 1. FIG. 5A to FIG. 5O each show a part region of the POWER-MIS region 6. FIG. 6A to FIG. 6O each show a part region of the n-MIS region 62 of the CMIS region 7.

Referring to FIG. 5A and FIG. 6A, first, a semiconductor wafer 92 formed in a disk-shape is prepared. The semiconductor wafer 92 includes a first main surface 93 on one side and a second main surface 94 on the other side. The first main surface 93 and the second main surface 94 of the semiconductor wafer 92 correspond to the first main surface 3 and the second main surface 4 of the semiconductor layer 2, respectively.

The semiconductor wafer 92 includes the semiconductor substrate 21 made of silicon and the epitaxial layer 22 made of silicon formed on the semiconductor substrate 21. The epitaxial layer 22 is formed by epitaxially growing silicon from a main surface of the semiconductor substrate 21.

A plurality of the semiconductor devices 1 is cut out from the semiconductor wafer 92. In FIG. 5A and FIG. 6A, a part of the POWER-MIS region 6 and a part of the n-MIS region 62 of the CMIS region 7 set with respect to an area where one semiconductor device 1 is to be formed are shown (Hereinafter the same in FIG. 5B to FIG. 5O and FIG. 6B and FIG. 6O).

Figure 5B:
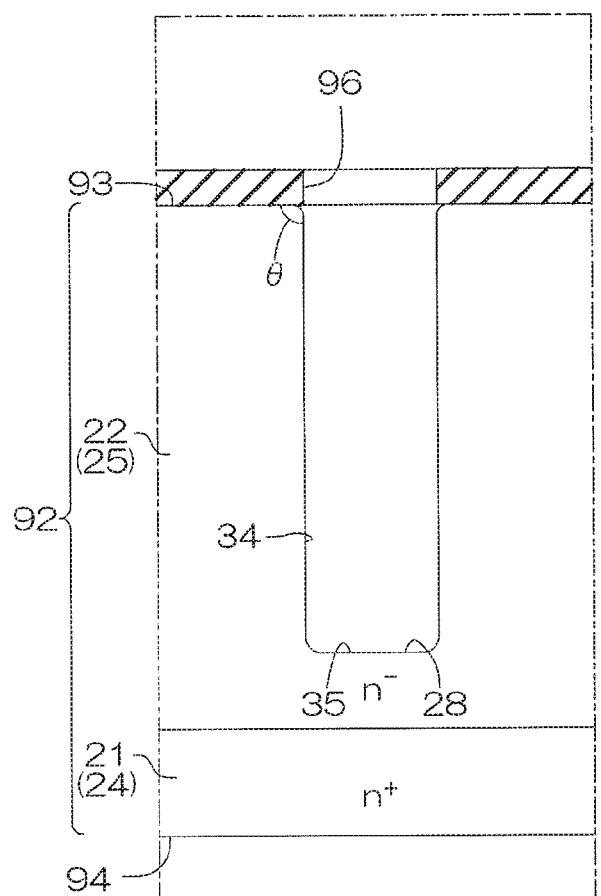

Next, referring to FIG. 5B and FIG. 6B, the mask 95 having a predetermined pattern is formed on the first main surface 93 of the semiconductor wafer 92. The mask 95 selectively has openings 96 in regions where the gate trench 28 and the device separation trench 64 are to be formed.

Next, the surface layer portion of the first main surface 93 of the semiconductor wafer 92 is selectively removed by an etching method via the mask 95. The gate trench 28 and the device separation trench 64 are thereby formed in the first main surface 93 of the semiconductor wafer 92. The gate trench 28 includes the side wall 34 and the bottom wall 35. The device separation trench 64 includes the side wall 67 and the bottom wall 68.

Figure 6C:
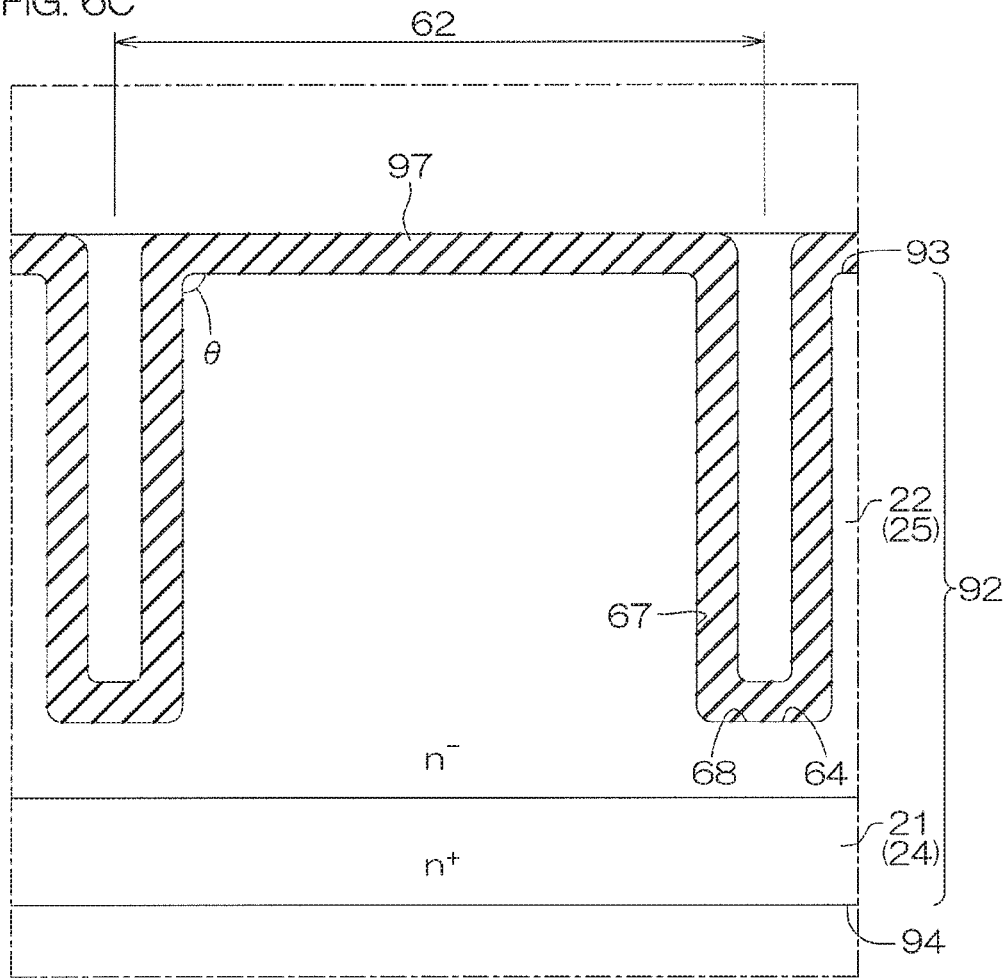
FIG. 6A to FIG. 6O are cross-sectional views showing the manufacturing method of the semiconductor device shown in FIG. 1 and showing a part of a CMIS region.

Next, referring to FIG. 5C and FIG. 6C, the insulating film 97 is formed. The insulating film 97 may be formed by a CVD (Chemical Vapor Deposition) method. The insulating film 97 is formed along the inner wall surface of the gate trench 28 and the inner wall surface of the device separation trench 64 in addition to the first main surface 93 of the semiconductor wafer 92.

An oxidation treatment (e.g. a thermal oxidation treatment) may be applied to the semiconductor wafer 92 before the step of forming the insulating film 97. In this case, a liner oxide film (not shown) is formed along the inner wall surface of the gate trench 28 and the inner wall surface of the device separation trench 64 in addition to the first main surface 93 of the semiconductor wafer 92.

In this step, the liner oxide film having a thickness smaller than a thickness of the insulating film 97 may be formed. The liner oxide film may have the thickness of equal to or greater than 100 Å and equal to or less than 2000 Å (e.g. about 1500 Å).

Next, referring to FIG. 5D and FIG. 6D, a first polysilicon layer 98 is formed on the first main surface 93 of the semiconductor wafer 92. The first polysilicon layer 98 may be formed by a CVD method. The first polysilicon layer 98 covers the first main surface 93 of the semiconductor wafer 92 and fills the gate trench 28 and the device separation trench 64.

The first polysilicon layer 98 may include a doped polysilicon into which an n-type impurity is introduced. The first polysilicon layer 98 may be formed by introducing the n-type impurity into the polysilicon layer simultaneously with the formation of the polysilicon layer.

Next, referring to FIG. 5E and FIG. 6E, an unnecessary portion of the first polysilicon layer 98 is selectively removed. The unnecessary portion of the first polysilicon layer 98 may be removed by an etching method (an etch-back method).

In the POWER-MIS region 6, the first polysilicon layer 98 is removed until its upper surface reaches a middle portion of the gate trench 28 in the depth direction. The embedded electrode 30 is thereby formed in the gate trench 28.

On the other hand, in the CMIS region 7, the first polysilicon layer 98 is removed to a position where the insulating film 97 is exposed. In the CMIS region 7, the upper surface of the first polysilicon layer 98 may be formed at a position protruding above the first main surface 93 of the semiconductor wafer 92. The device separation electrode 66 is thereby formed in the device separation trench 64.

Next, referring to FIG. 5F and FIG. 6F, an unnecessary portion of the insulating film 97 is selectively removed. The unnecessary portion of the insulating film 97 may be removed by an etching method (an etch-back method). The etching method may include a wet etching method using a chemical liquid.

In the POWER-MIS region 6, the insulating film 97 is selectively removed until the upper end portion of the embedded electrode 30 is exposed. The lower insulating film 29 is thereby formed in the gate trench 28.

On the other hand, in the CMIS region 7, a portion covering the first main surface 93 of the semiconductor wafer 92 in the insulating film 97 is selectively removed. The device separation insulating film 65 is thereby formed in the device separation trench 64.

Figure 5G:
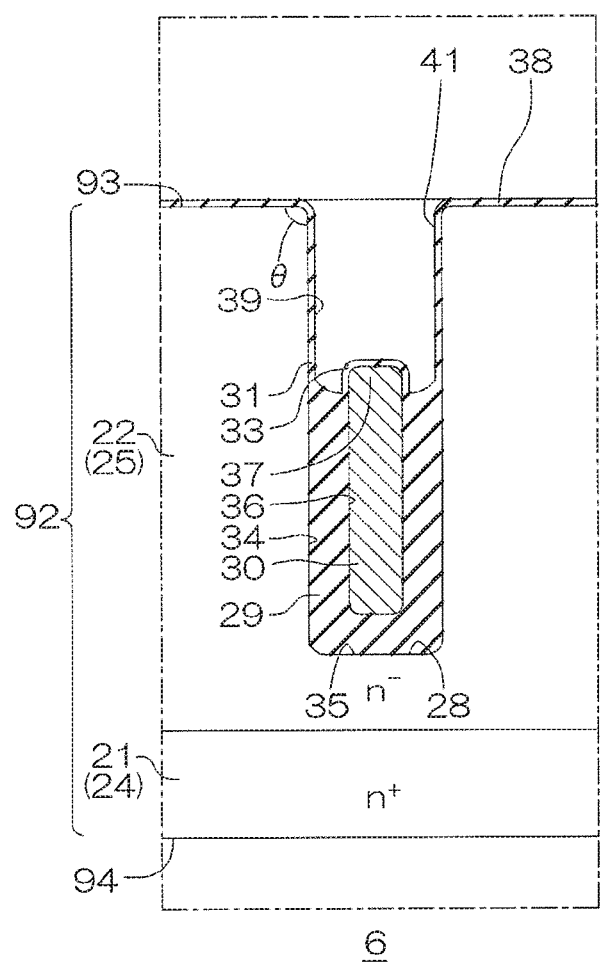
Figure 5:
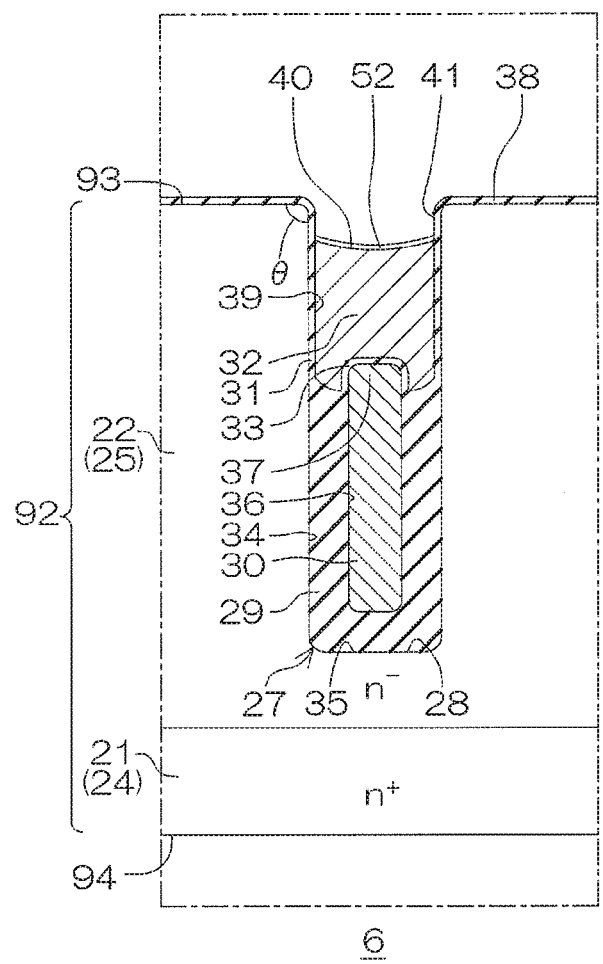

Next, referring to FIG. 5G and FIG. 6G, an oxidation treatment (e.g. a thermal oxidation treatment) is applied to the semiconductor wafer 92. The surface insulating film 38 is thereby formed in a region exposed from the lower insulating film 29 in the first main surface 93 of the semiconductor wafer 92 in the POWER-MIS region 6. In the POWER-MIS region 6, the gate insulating film 31 is also formed on the side wall 34 of the gate trench 28 exposed from the lower insulating film 29. In the POWER-MIS region 6, the intermediate insulating film 33 is also formed at the upper end portion of the embedded electrode 30 exposed from the lower insulating film 29.

On the other hand, in the CMIS region 7, the surface insulating film 38 is formed in a region exposed from the device separation insulating film 65 in the first main surface 93 of the semiconductor wafer 92. In the CMIS region 7, the upper insulating film 69 is formed on the upper surface of the device separation electrode 66. The gate insulating film 31, the intermediate insulating film 33, the surface insulating film 38 and the upper insulating film 69 each include $SiO_2$.

Next, referring to FIG. 5H and FIG. 6H, a second polysilicon layer 100 (a conductive layer) is formed on the first main surface 93 of the semiconductor wafer 92. The second polysilicon layer 100 may be formed by a CVD method. The second polysilicon layer 100 covers the first main surface 93 of the semiconductor wafer 92 and fills the gate trench 28.

The second polysilicon layer 100 may include a doped polysilicon into which an n-type impurity is introduced. The second polysilicon layer 100 may be formed by introducing the n-type impurity into the polysilicon layer simultaneously with the formation of the polysilicon layer.

Next, referring to FIG. 5I and FIG. 6I, an unnecessary portion of the second polysilicon layer 100 is selectively removed. The unnecessary portion of the second polysilicon layer 100 may be removed by an etching method (e.g. an etch-back method). The etching method may include a dry etching method (e.g. a RIE (Reactive Ion Etching) method or the like).

In the POWER-MIS region 6, the second polysilicon layer 100 is further removed after the surface insulating film 38 is exposed. The second polysilicon layer 100 is eventually removed until its upper surface is located below the first main surface 93 of the semiconductor wafer 92.

The gate electrode 32 where the upper surface 40 is located below the first main surface 93 of the semiconductor wafer 92 in the gate trench 28 is thereby formed. After the step of removing the second polysilicon layer 100, the upper insulating film 52 composed of a natural oxide film, a thermal oxide film, or the like may be formed on the upper surface 40 of the gate electrode 32.

On the other hand, in the CMIS region 7, the second polysilicon layer 100 is removed until the upper insulating film 69 covering the device separation electrode 66 is exposed. Here, the upper insulating film 69 functions as an etching stop film. The device separation structure 61 having the structure in which the device separation electrode 66 is embedded in the device separation trench 64 with the device separation insulating film 65 interposed therebetween is thereby formed.

Figure 5J:
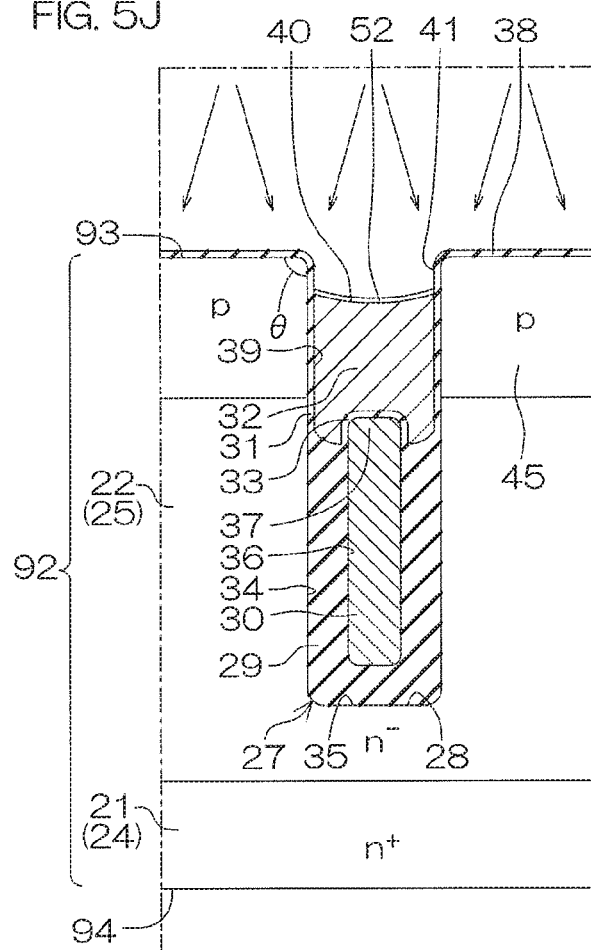
Figure 6J:
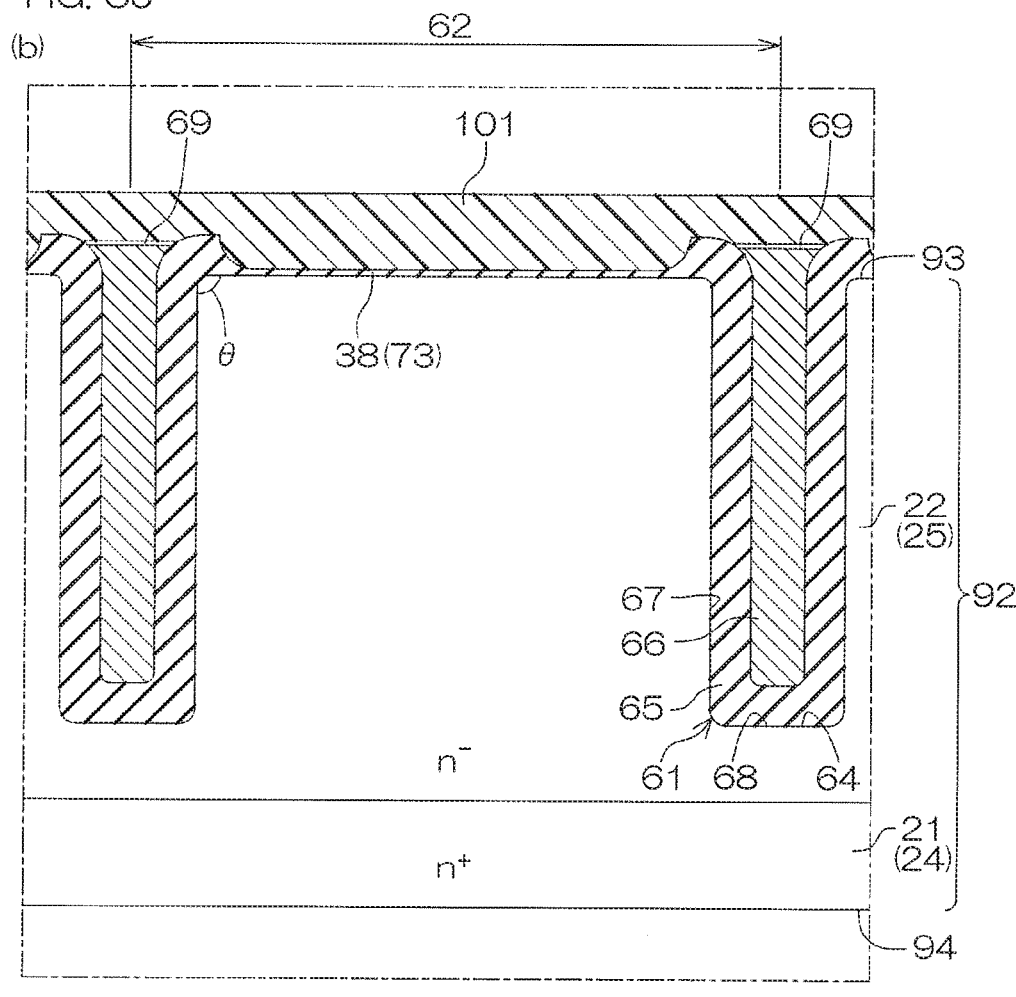

Next, referring to FIG. 5J and FIG. 6J, a p-type impurity is introduced into the surface layer portion of the first main surface 93 of the semiconductor wafer 92. In this step, an ion implantation mask 101 having a predetermined pattern is first formed on the first main surface 93 of the semiconductor wafer 92. The ion implantation mask 101 has openings (not shown) selectively exposing regions where the body regions 45 of the POWER-MIS region 6 are to be formed.

Next, the p-type impurity is introduced into the surface layer portion of the first main surface 93 of the semiconductor wafer 92. The p-type impurity may be introduced into the semiconductor wafer 92 by oblique-ion-implantation method via the ion implantation mask 101. An absolute value of an implantation angle of the p-type impurity may be equal to or greater than 5° and equal to or less than 10° when a normal direction of the first main surface 93 of the semiconductor wafer 92 is defined as 0°.

The p-type impurity is introduced from the side wall 34 of the gate trench 28 and the first main surface 93 of the semiconductor wafer 92 to the surface layer portion of the first main surface 93 of the semiconductor wafer 92. After the p-type impurity is introduced, the ion implantation mask 101 is removed. Thereafter, the body region 45 is formed through a heat treatment process.

Although not specifically described, in the CMIS region 7, a p-type impurity and a n-type impurity is selectively introduced into the surface layer portion of the first main surface 93 of the semiconductor wafer 92 by an ion implantation method via ion implantation masks (not shown), respectively.

The p-type well region 70 is thereby formed in the surface layer portion of the first main surface 93 of the semiconductor wafer 92 in the n-MIS region 62. In the p-MIS region 63, the p-type well region 79 and the n-type well region 80 are also formed in the surface layer portion of the first main surface 93 of the semiconductor wafer 92.

Next, referring to FIG. 5K and FIG. 6K, a third polysilicon layer 102 covering the first main surface 93 of the semiconductor wafer 92 is formed in the n-MIS region 62 and the p-MIS region 63.

The third polysilicon layer 102 may include a doped polysilicon into which a n-type impurity is introduced. The third polysilicon layer 102 may be formed by introducing the n-type impurity into the polysilicon layer simultaneously with the formation of the polysilicon layer.

Next, the third polysilicon layer 102 is selectively patterned. The n-MIS gate electrode 74 is thereby formed in the n-MIS region 62, and the p-MIS gate electrode 84 is thereby formed in the p-MIS region 63.

Next, an insulating layer 103 is formed so as to cover the first main surface 93 of the semiconductor wafer 92. The insulating layer 103 may be formed by a CVD method. Here, an example in which the insulating layer 103 includes $SiO_2$ is described.

In the POWER-MIS region 6, the insulating layer 103 is entered into the recessed portion 41 defined by the side wall 34 of the gate trench 28 and the upper surface 40 of the gate electrode 32. In the CMIS region 7, the insulating layer 103 covers the n-MIS gate electrode 74 and the p-MIS gate electrode 84.

Figure 5L:
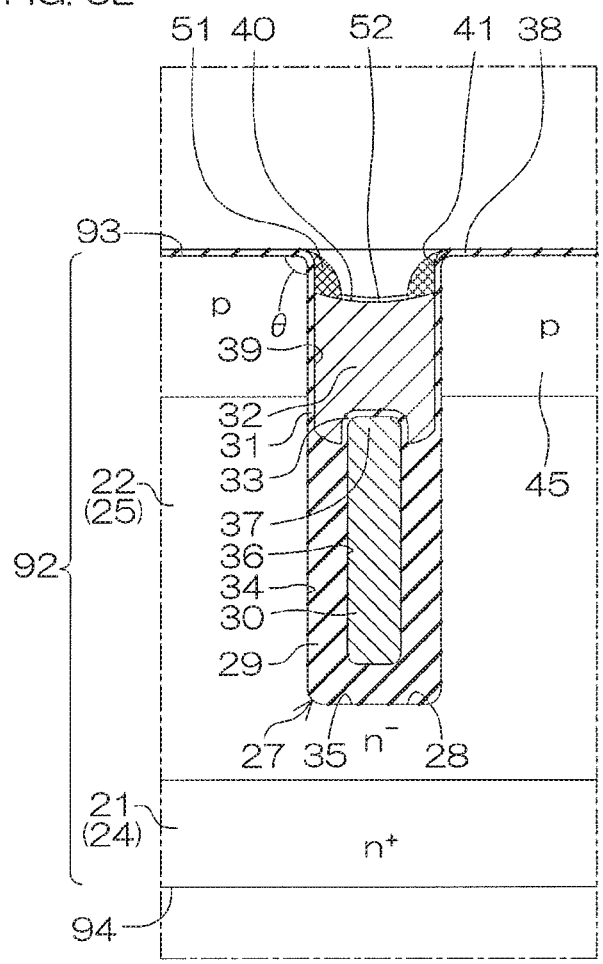
Figure 6L:
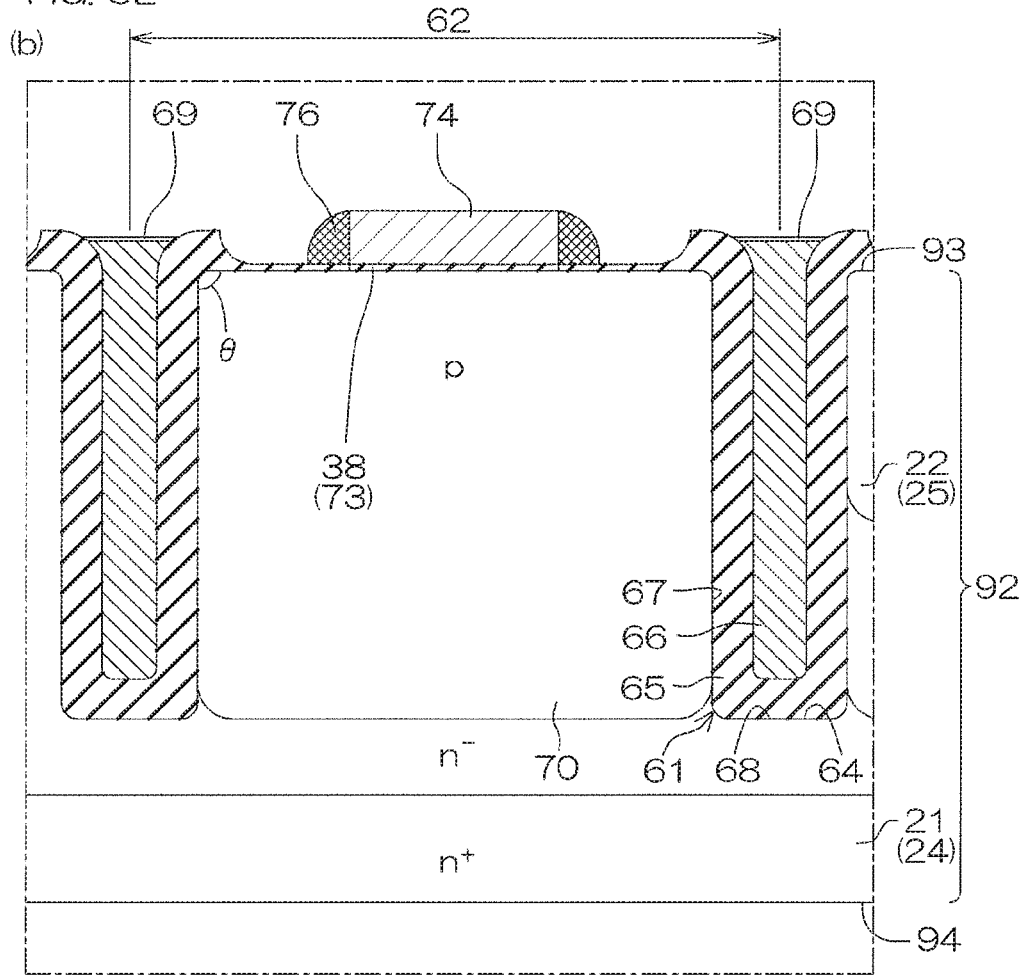
Figure 60:
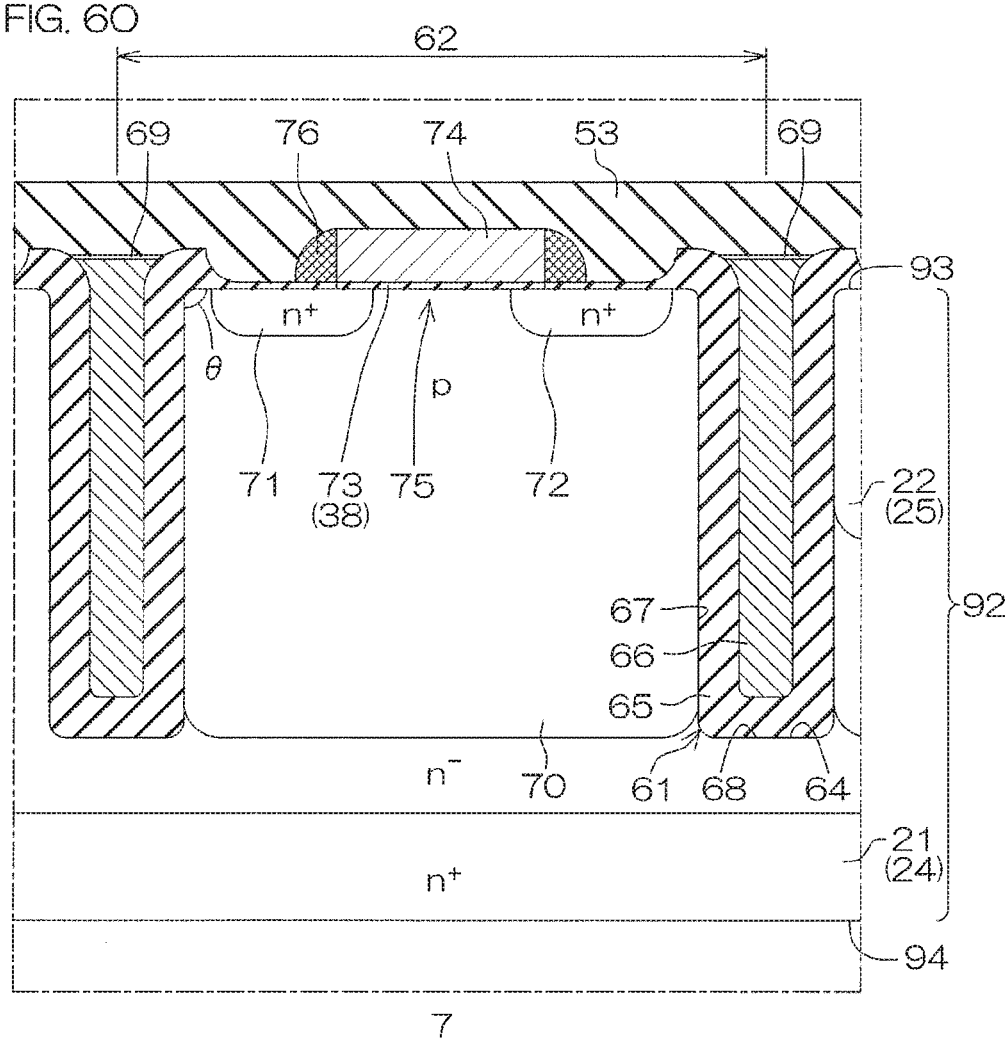

Next, referring to FIG. 5L and FIG. 6L, a region of the insulating layer 103 along the first main surface 93 of the semiconductor wafer 92 is selectively removed. An unnecessary portion of the insulating layer 103 is removed by an etching method (e.g. an etch-back method). The etching method may include a dry etching method.

In the recessed portion 41, a part of the insulating layer 103 remains in a state adhered to the side wall 34 of the gate trench 28. The side wall insulating layer 51 is thereby formed in a self-aligned manner with respect to the first main surface 93 of the semiconductor wafer 92 in the recessed portion 41.

On the other hand, in the n-MIS region 62 of the CMIS region 7, a part of the insulating layer 103 remains in a state adhered to the side wall of the n-MIS gate electrode 74. The first side wall 76 covering the side wall of the n-MIS gate electrode 74 is thereby formed in a self-aligned manner with respect to the n-MIS gate electrode 74.

In the p-MIS region 63 of the CMIS region 7, a part of the insulating layer 103 remains in a state adhered to the side wall of the p-MIS gate electrode 84. The second side wall 86 covering the side wall of the p-MIS gate electrode 84 is thereby formed in a self-aligned manner with respect to the p-MIS gate electrode 84.

Next, referring to FIG. 5M and FIG. 6M, an n-type impurity is introduced into the surface layer portion of the first main surface 93 of the semiconductor wafer 92. More specifically, an ion implantation mask 104 having a predetermined pattern is formed on the first main surface 93 of the semiconductor wafer 92.

The ion implantation mask 104 has openings 105 selectively exposes regions where the source region 46 of the POWER-MIS region 6 and the n⁺-type source region 71 of the CMIS region 7 (the n-MIS region 62) are to be formed.

Next, the n-type impurity is introduced into the surface layer portion of the first main surface 93 of the semiconductor wafer 92 by an oblique-ion-implantation method via the ion implantation mask 104. An absolute value of an implantation angle of the n-type impurity may be equal to or greater than 5° and equal to or smaller than 35° when the normal direction of the first main surface 93 of the semiconductor wafer 92 is defined as 0°.

In the POWER-MIS region 6, the n-type impurity is introduced into the surface layer portion of the body region 45 from the side wall 34 of the gate trench 28 and the first main surface 93 of the semiconductor wafer 92. The n-type impurity directed to the side wall 34 of the gate trench 28 is introduced into the surface layer portion of the body region 45 via the side wall insulating layer 51 and the gate insulating film 31.

In the n-MIS region 62 of the CMIS region 7, n-type impurity is introduced into the surface layer portion of the p-type well region 70 along the first side wall 76. After introducing the n-type impurity, the ion implantation mask 104 is removed. Thereafter, through a heat treatment process, the source region 46, the n⁺-type source region 71 and the n⁺-type drain region 72 are formed.

The n⁺-type source region 71 and the n⁺-type drain region 72 of the CMIS region 7 may be formed through different steps from the steps of forming the source region 46 of the POWER-MIS region 6. The n⁺-type source region 71 and the n⁺-type drain region 72 may be formed in an n-type impurity concentration and a depth different from the n-type impurity concentration and the depth of the source region 46.

Next, referring to FIG. 5N and FIG. 6N, a p-type impurity is introduced into the surface layer portion of the first main surface 93 of the semiconductor wafer 92. More specifically, an ion implantation mask 106 having a predetermined pattern is formed on the first main surface 93 of the semiconductor wafer 92.

The ion implantation mask 106 has openings 107 selectively exposes regions where the contact region 47 of the POWER-MIS region 6 and the p⁺-type source region 81 of the CMIS region 7 (the p-MIS region 63) are to be formed.

Next, the p-type impurity is introduced into the surface layer portion of the first main surface 93 of the semiconductor wafer 92 by an oblique-ion-implantation method via the ion implantation mask 106. An absolute value of an implantation angle of the p-type impurity may be equal to or greater than 5° and equal to or smaller than 35° when the normal direction of the first main surface 93 of the semiconductor wafer 92 is defined as 0°.

In the POWER-MIS region 6, the p-type impurity is selectively introduced into the surface layer portion of the body region 45. In the POWER-MIS region 6, a portion of the p-type impurity may be introduced into the surface layer portion of the body region 45 via the side wall insulating layer 51 and the gate insulating film 31. The contact region 47 is thereby formed along the side wall 34 of the gate trench 28.

In the p-MIS region 63 of the CMIS region 7, the p-type impurity is selectively introduced into the surface layer portion of the n-type well region 80 along the second side wall 86. After the p-type impurity is introduced, the ion implantation mask 106 is removed. Thereafter, through the heat treatment process, the contact region 47, the p⁺-type source region 81 and the p⁺-type drain region 82 are formed.

The p⁺-type source region 81 and the p⁺-type drain region 82 of the CMIS region 7 may be formed through different steps from the steps of forming the contact region 47 of the POWER-MIS region 6. The p⁺-type source region 81 and the p⁺-type drain region 82 may be formed in a p-type impurity concentration and a depth different from the p-type impurity concentration and the depth of the contact region 47.

Next, referring to FIG. 5O and FIG. 6O, the interlayer insulating layer 53 covering the first main surface 93 of the semiconductor wafer 92 is formed. The interlayer insulating layer 53 may be formed by a CVD method.

Next, an unnecessary portion of the interlayer insulating layer 53 is selectively removed. The unnecessary portion of the interlayer insulating layer 53 may be removed by an etching method via a mask (not shown). The contact holes 54 exposing the source region 46 and the contact region 47 are thereby formed in the interlayer insulating layer 53 in the POWER-MIS region 6.

Thereafter, the gate pad electrode 10 and the source pad electrode 11 are selectively formed on the interlayer insulating layer 53, and the drain electrode 23 is formed on the second main surface 94 of the semiconductor wafer 92.

An example of the semiconductor wafer structure manufactured through the above steps is shown in FIG. 7. FIG. 7 is a schematic plan view showing the semiconductor wafer structure 111 manufactured during the manufacture of the semiconductor device 1 shown in FIG. 1.

The semiconductor wafer structure 111 includes the semiconductor wafer 92. A plurality of device formation regions 112 in each of which the semiconductor device 1 is to be formed is set in the first main surface 93 of the semiconductor wafer 92. The plurality of the device formation regions 112 is arranged in rows and columns at intervals along an arbitrary first direction and an arbitrary second direction intersecting the first direction in the plan view. The second direction is a direction orthogonal to the first direction in this preferred embodiment.

The plurality of the device formation regions 112 is partitioned from each other by a dicing line 113. The dicing line 113 is set in a lattice shape including first lines extending along the first direction and second lines extending along the second direction in the plan view.

The first lines of the dicing line 113 partition the plurality of the device formation regions 112 adjacent to each other along the second direction. The second lines of the dicing line 113 partition the plurality of the device formation regions 112 adjacent to each other along the first direction. The plurality of the semiconductor devices 1 is cut out by cutting the semiconductor wafer structure 111 along the dicing line 113.

The device formation regions 112 include first device formation regions 112A and second device formation regions 112B. The first device formation regions 112A are arbitrary device formation regions 112 set at the center portion of the first main surface 93 of the semiconductor wafer 92. In FIG. 7, the plurality (5×5 pieces) of the device formation regions 112 set in an arbitrary region in the center portion of the first main surface 93 of the semiconductor wafer 92 is set as the first device formation regions 112A.

The second device formation regions 112B are arbitrary device formation regions 112 set at a periphery side of the semiconductor wafer 92 with respect to the first device formation regions 112A. FIG. 7 shows an example in which the second device formation regions 112B are set along a peripheral portion of the first main surface 93 of the semiconductor wafer 92. In FIG. 7, the plurality (5×5 pieces) of the device formation regions 112 set in an arbitrary region in the peripheral portion of the first main surface 93 of the semiconductor wafer 92 is set as the second device formation regions 112B.

The peripheral portion of the semiconductor wafer 92 includes an arbitrary annular region set along the periphery of the semiconductor wafer 92 so as to surround the center portion of the semiconductor wafer 92. The width r of the peripheral portion of the semiconductor wafer 92 may be equal to or less than 50% of the radius R of the semiconductor wafer 92. FIG. 7 shows an example in which the width r of the peripheral portion of the semiconductor wafer 92 is about 10% of the radius R of the semiconductor wafer 92.

Figure 9:
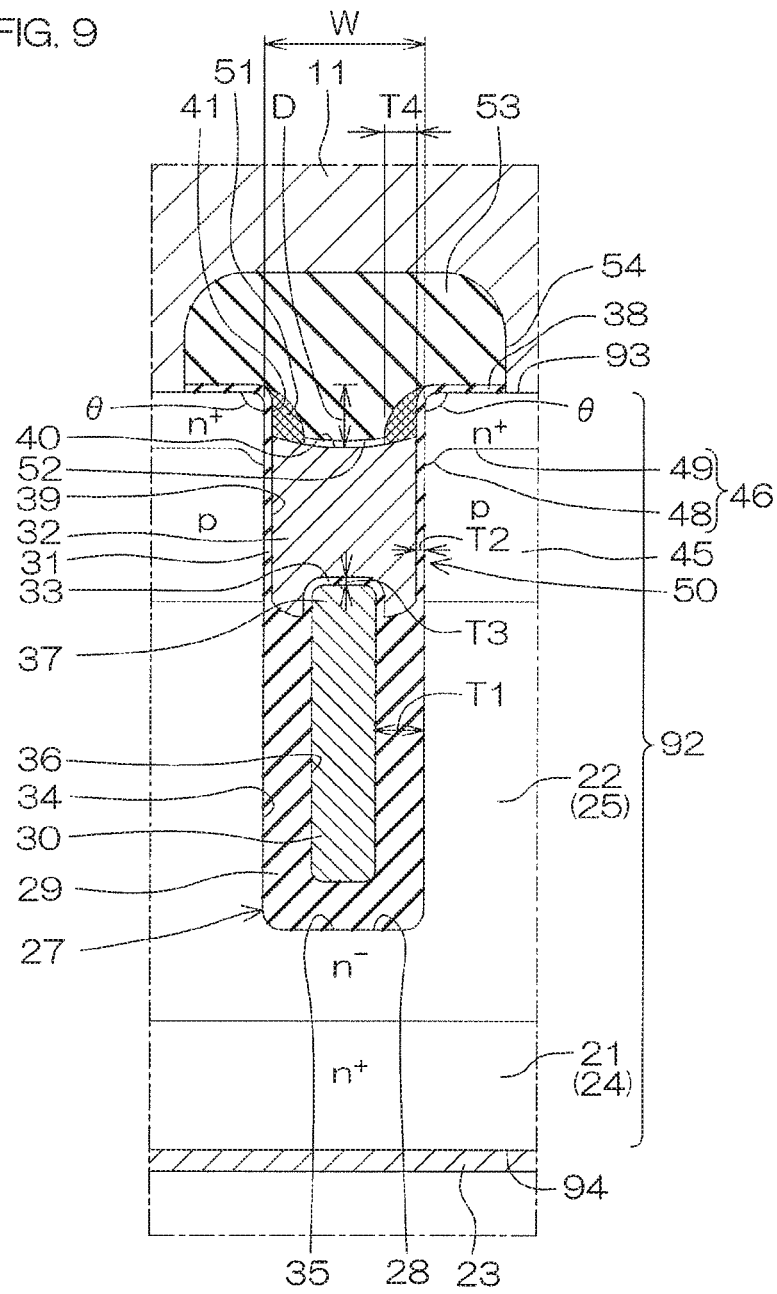
FIG. 9 is a cross-sectional view of a trench gate structure formed in a second device formation region of the semiconductor wafer structure shown in FIG. 7.

FIG. 8 is a cross-sectional view of the trench gate structure 27 formed in the first device formation region 112A of the semiconductor wafer structure 111 shown in FIG. 7. FIG. 9 is a cross-sectional view of the trench gate structure 27 formed in the second device formation region 112B of the semiconductor wafer structure 111 shown in FIG. 7.

Referring to FIG. 8 and FIG. 9, the upper surface 40 of the gate electrode 32 formed in the second device formation region 112B is positioned below the upper surface 40 of the gate electrode 32 formed in the first device formation region 112A in the semiconductor wafer structure 111.

That is, in the semiconductor wafer structure 111, there is a difference in the depth D of the recessed portion 41 between the first device formation region 112A and the second device formation region 112B. This is because a manufacturing error occurred in the removal time of the second polysilicon layer 100 according to the dry etching method during the etch-back process of the second polysilicon layer 100 (see FIG. 5I and FIG. 6I).

In other words, in this preferred embodiment, the time to be exposed to gas or ions during the dry etching method of the peripheral portion of the semiconductor wafer 92 is longer than that of the center portion of the semiconductor wafer 92. Therefore, the amount of removal of the second polysilicon layer 100 at the side of the second device formation region 112B is larger than that of the first device formation region 112A side.

As a result, over-etching causes the depth D of the recessed portion 41 of the second device formation region 112B to be greater than the depth D of the recessed portion 41 of the first device formation region 112A. The manufacturing method in which such a tendency exists, the depth D of the recessed portions 41 gradually increase from the center portion of the semiconductor wafer 92 toward the peripheral portion of the semiconductor wafer 92.

The depth D of the recessed portion 41 of the first device formation region 112A may be equal to or greater than 1000 Å and equal to or less than 3000 Å (1000 Å≤D≤3000 Å). The depth D of the recessed portion 41 of the second device formation region 112B may be greater than 3000 Å and equal to or less than 6000 Å (3000 Å<D≤6000 Å).

Referring to FIG. 8 and FIG. 9, the lower portion of the body region 45 formed in the second device formation region 112B is positioned below the lower portion of the body region 45 formed in the first device formation region 112A.

This is because the p-type impurity is introduced into the surface layer portion of the first main surface 93 of semiconductor wafer 92 from the side wall 34 of the gate trench 28 according to the oblique ion implantation method during the step of forming the body region 45 (see FIG. 5J and FIG. 6J).

That is, the depth D of the recessed portion 41 of the second device formation region 112B is greater than the depth D of the recessed portion 41 of the first device formation region 112A. In the oblique ion implantation method, the implantable area of the p-type impurity in the second device formation region 112B is larger than the implantable area of the p-type impurity in the first device formation region 112A. Therefore, in the second device formation regions 112B, the p-type impurity is introduced deeper position in the surface layer portion of the first main surface 93 of the semiconductor wafer 92 than in the first device formation regions 112A.

Hereinafter, the semiconductor wafer structure 111 having a structure free from the side wall insulating layer 51 shall now be considered. The simulation results of the channel length of the channel 50 when the depth D of the recessed portion 41 was adjusted in the semiconductor wafer structure 111 having the structure free from the side wall insulating layer 51 is shown in FIG. 10.

Figure 10:
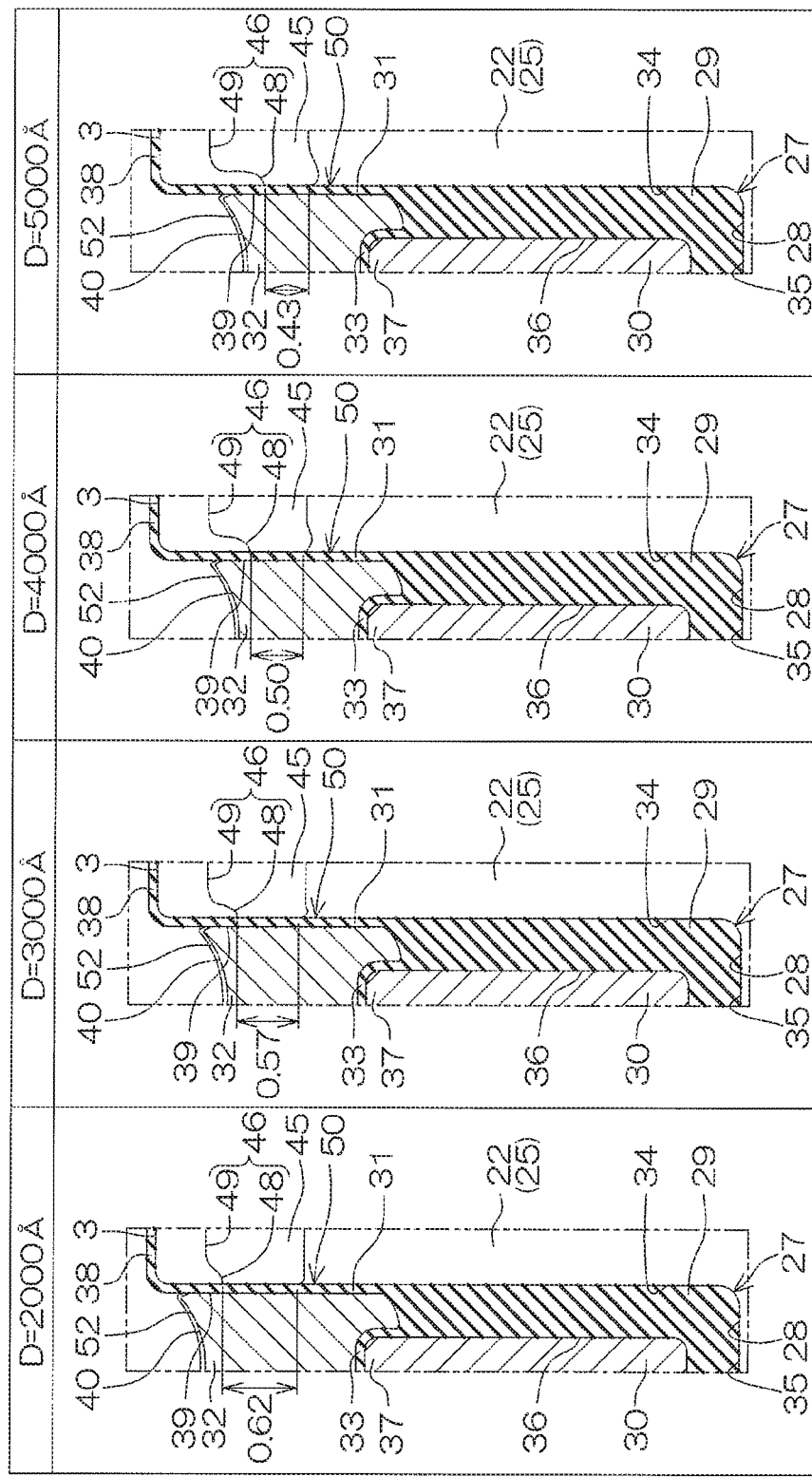
FIG. 10 is a view showing a result of simulation of a channel length of a channel when a depth of a recessed portion in the semiconductor wafer structure having a structure where a second device formation region is free from a side wall insulation layer is adjusted.

FIG. 10 shows the results of examining the channel length of the channel 50 when the depth D of the recessed portion 41 was set to 2000 Å, 3000 Å, 4000 Å and 5000 Å, respectively. The designed value of the channel length of the channel 50 was set to 0.65 μm.

Referring to FIG. 10, in the semiconductor wafer structure 111 having a structure free from the side wall insulating layer 51, as the depth D of the recessed portion 41 increases, the first portion 48 of the source region 46 was formed at a position deeper than the second portion 49 of the source region 46. Therefore, as the depth D of the recessed portion 41 increases, the channel length becomes shorter.

The depth D of the recessed portion 41 formed in the second device formation region 112B is greater than the depth D of the recessed portion 41 formed in the first device formation region 112A. Therefore, in the semiconductor wafer structure 111 having a structure free from the side wall insulating layer 51, the implantable area of the n-type impurity with respect to the second device formation region 112B become larger than the implantable area of the n-type impurity with respect to the first device formation region 112A.

Therefore, in the second device formation region 112B, the n-type impurity is introduced deep position in the surface layer portion of the body region 45, compared to the first device formation region 112A. In such a structure, the channel length of the channel 50 formed in the body region 45 of the second device formation region 112B becomes shortened.

As a result, variations occur between the electrical characteristics of the semiconductor device 1 obtainable from the first device formation region 112A and the electrical characteristics of the semiconductor device 1 obtainable from the second device formation region 112B.

Figure 11:
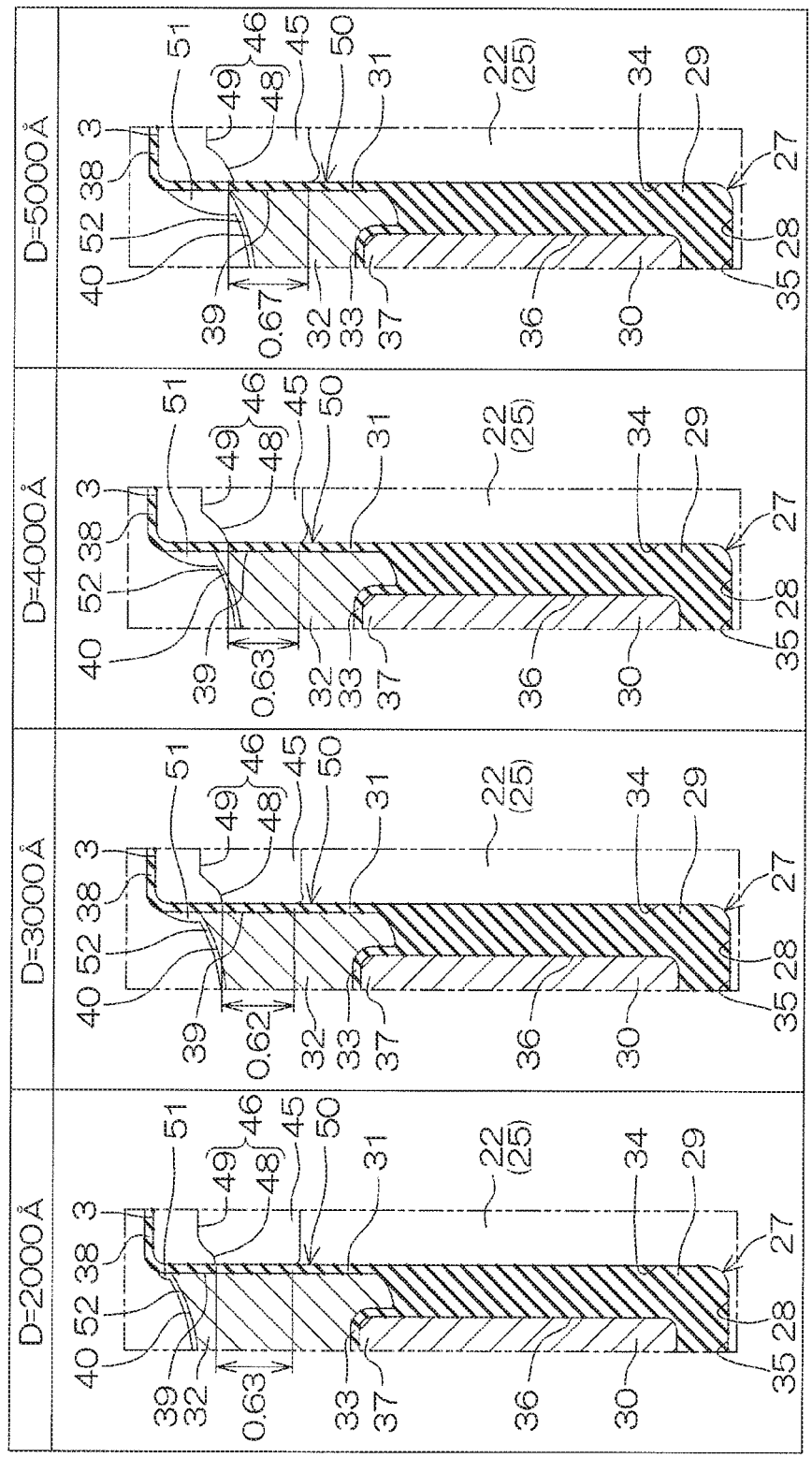
FIG. 11 is a view showing a result of simulation of a channel length of a channel when a depth of a recessed portion in the semiconductor wafer structure shown in FIG. 7 is adjusted.

FIG. 11 shows the simulation results of the channel length of the channel 50 when the depth D of the recessed portion 41 was adjusted in the semiconductor wafer structure 111 according to the present embodiment.

FIG. 11 shows the results of examining the channel length of the channel 50 when the depth D of the recessed portion 41 was set to 2000 Å, 3000 Å, 4000 Å and 5000 Å, respectively. The designed value of the channel length of the channel 50 is set to 0.65 μm.

Referring to FIG. 11, in the semiconductor wafer structure 111 according to the present embodiment, even if the depth D of the recessed portion 41 became large, it is suppressed that the first portion 48 of the source region 46 was formed in the deep position of the surface layer portion of the body region 45. Therefore, the variation of the channel length due to the variation of the depth D of the recessed portion 41 is suppressed.

This is because n-type impurity was introduced into the surface layer portion of the body region 45 through the side wall insulating layer 51 during the step of forming the source region 46 (see FIG. 5M and FIG. 6M). In this step, the side wall insulating layer 51 suppressed n-type impurity from being introduced in the deep position of the surface layer portion of the body region 45.

In the first device formation region 112A where the depth D of the recessed portion 41 was equal to or greater than 1000 Å and equal to or less than 3000 Å, most of the side wall 34 of the gate trench 28 was covered with the gate electrode 32. Therefore, in the first device formation regions 112A, it is suppressed that the n-type impurity is introduced into the deep position of the surface layer portion of the body region 45 by the gate electrode 32.

On the other hand, in the second device formation region 112B where the depth D of the recessed portion 41 was greater than 3000 Å and equal to or less than 6000 Å, the side wall insulating layer 51 was formed so as to cover the side wall 34 of the gate trench 28. Therefore, in the second device formation regions 112B, it is suppressed that the n-type impurity is introduced into the deep position of the surface layer portion of the body region 45 by the side wall insulating layer 51.

As a result, even if the depth D of the recessed portion 41 and the depth of the body region 45 are different, it is possible to suppress the occurrence of a variation in the channel length of the channel 50 between the first device formation region 112A and the second device formation region 112B.

In this preferred embodiment, the side wall insulating layer 51 is also formed in the first device formation regions 112A in addition to the second device formation regions 112B. Therefore, it is possible to suppress the n-type impurity from being introduced into the deep position of the surface layer portion of the body region 45 in the first device formation regions 112A as well. Accordingly, the variation in the channel length of the channel 50 between the first device formation region 112A and the second device formation region 112B can be further suppressed.

In the semiconductor wafer structure 111 according to the present preferred embodiment, an absolute value of the difference between the first channel length of the channel 50 formed in the first device formation region 112A and the second channel length of the channel 50 formed in the second device formation region 112B can be kept within a range of equal to or greater than 0% and equal to or less than 10% of an average value obtained from the first channel length and the second channel length. Also, the absolute value of the difference between the first channel length and the second channel length can be kept within a range of equal to or greater than 0 μm and equal to or less than 0.1 μm.

As described above, according to the manufacturing method of the semiconductor device 1, the side wall insulating layer 51 covering the side wall 34 of the gate trench 28 is formed in the recessed portion 41 defined by the side wall 34 of the gate trench 28 and the upper surface 40 of the gate electrode 32. In the step of forming the source region 46, the n-type impurity is introduced into the surface layer portion of the body region 45 via the side wall insulating layer 51.

Accordingly, it can be suppressed by the side wall insulating layer 51 that the n-type impurity is introduced in a deep position of the surface layer portion of the body region 45. This can suppress shortening of the distance between the lower portion of the body region 45 and the lower portion of the source region 46 so that it is possible to suppress the reduction of the channel length of the channel 50 formed in the body region 45.

As a result, it is possible to manufacture the semiconductor device 1 and the semiconductor wafer structure 111 each having a structure capable of suppressing the fluctuation in the electrical characteristics such as an increase in a leakage current and a decrease in a threshold voltage with respect to a designed value.

According to the semiconductor wafer structure 111, it is possible to suppress the occurrence of the variation between the first channel length of the channel 50 formed in the body region 45 of the first device formation region 112A and the second channel length of the channel 50 formed in the body region 45 of the second device formation region 112B.

As a result, it is possible to suppress the occurrence of the variation between the electrical characteristics of the semiconductor device 1 (the first semiconductor device) obtainable from the first device formation region 112A and the electrical characteristics of the semiconductor device 1 (the second semiconductor device) obtainable from the second device formation region 112B. Therefore, the yield can be improved.

Further, according to the method of manufacturing the semiconductor device 1 of the present preferred embodiment, the step of forming the side wall insulating layer 51 of the POWER-MIS region 6 and the step of forming the first side wall 76 and the second side wall 86 of the CMIS region 7 are executed at the same time (see FIG. 5K and FIG. 6K and FIG. 5L and FIG. 6L).

Therefore, the side wall insulating layer 51 can be formed without increasing the number of steps when the steps of forming the first side wall 76 and the second side wall 86 has been already carried out. As a result, it is possible to suppress an increase in cost accompanying the addition of the side wall insulating layer 51.

Figure 12:
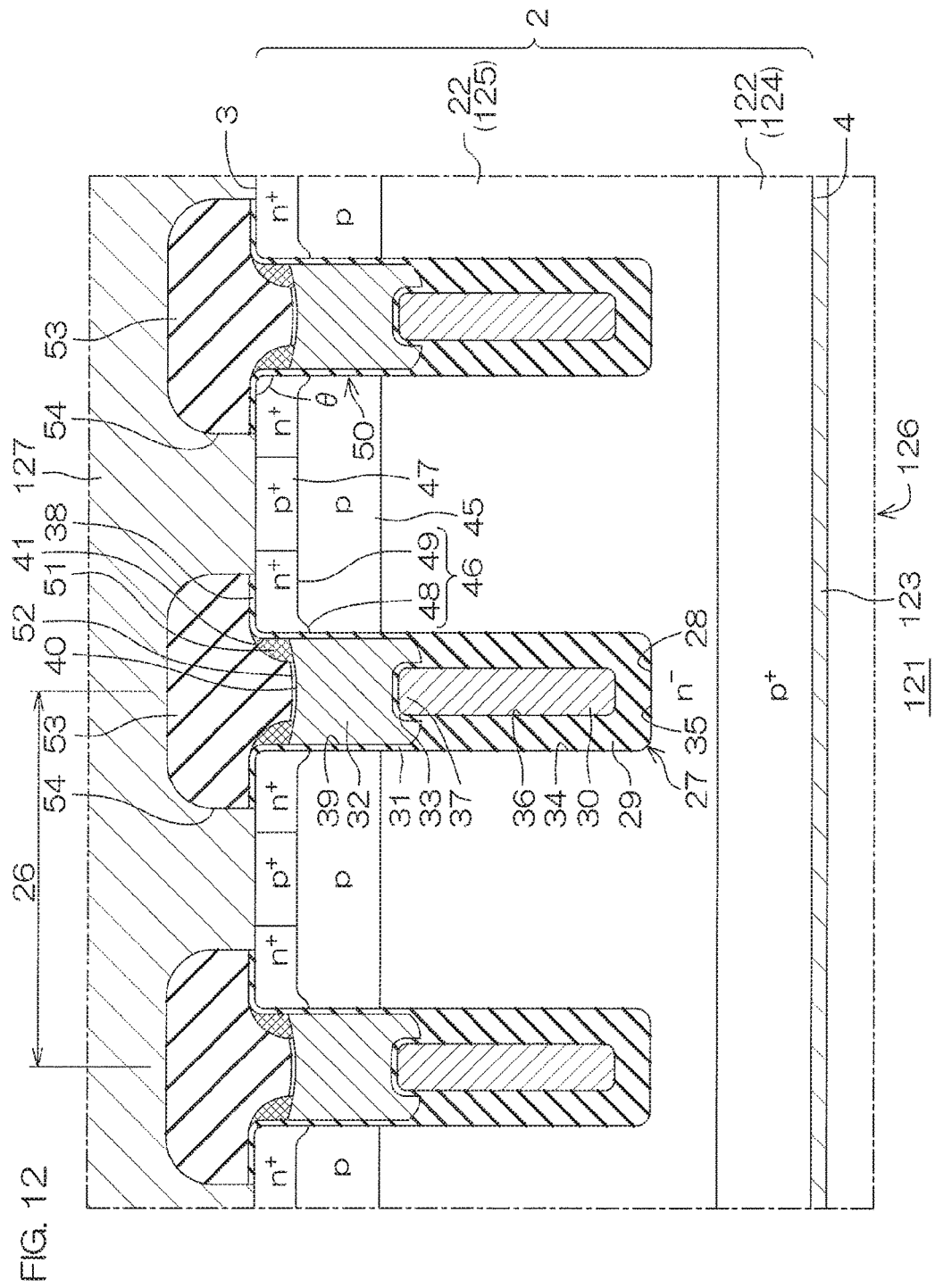
FIG. 12 is a cross-sectional view of a portion corresponding to FIG. 2 and shows a semiconductor device according to a second preferred embodiment of the present invention.

FIG. 12 is a cross-sectional view of a portion corresponding to FIG. 2, showing a semiconductor device 121 according to a second preferred embodiment of the present invention. Hereinafter, the configurations corresponding to the configurations of the semiconductor device 1 will be denoted by the same reference numerals, and descriptions thereof will be omitted.

The semiconductor device 121 is different from the semiconductor device 1 in that the semiconductor device 121 has a structure including a POWER-IGBT (Insulated Gate Bipolar Transistor) region 126 instead of the POWER-MIS region 6. The POWER-IGBT region 126 includes a trench gate type IGBT.

More specifically, the semiconductor layer 2 includes a $p^+$-type semiconductor substrate 122 made of silicon instead of the semiconductor substrate 21 in this preferred embodiment. And a collector electrode 123 is connected to the second main surface 4 of the semiconductor layer 2 instead of the drain electrode 23.

Accordingly, the $p^+$-type semiconductor substrate 122 is formed as a $p^+$-type collector region 124. And the epitaxial layer 22 is formed as an n-type collector drift region 125. As an electrode material of the collector electrode 123, the same material as the electrode material of the surface electrode 9 can be applied.

The source pad electrode 11 and the source region 46 of the MISFET correspond to an emitter pad electrode 127 and an emitter pad electrode 127 (a first conductivity type region) of the IGBT, respectively.

As described above, the semiconductor device 121 can also achieve substantially the same working effect as the working effect described with respect to the semiconductor device 1.

FIG. 13 is a cross-sectional view of a portion corresponding to FIG. 2 and shows a semiconductor device 131 according to a third preferred embodiment of the present invention. Hereinafter, the configurations corresponding to the configurations of the semiconductor device 1 will be denoted by the same reference numerals, and descriptions thereof will be omitted.

The semiconductor device 131 is different from the semiconductor device 1 in that the trench gate structure 27 is free from the lower insulating film 29 and the embedded electrode 30.

The trench gate structure 27 includes the gate insulating film 31 formed along the side wall 34 and the bottom wall 35 of the gate trench 28, and the gate electrode 32 embedded in the gate trench 28 with the gate insulating film 31 interposed therebetween in this preferred embodiment. The width W of the gate trench 28 may be equal to or greater than 0.5 μm and equal to or less than 2 μm.

As described above, the semiconductor device 131 can also achieve substantially the same working effect as the working effect described with respect to the semiconductor device 1.

Although the preferred embodiments of the present invention have been described above, the present invention can be also practiced in still other embodiments.

In each of the aforementioned embodiments, an example in which the side wall insulating layer 51 is formed in both the first device formation region 112A and the second device formation region 112B in the semiconductor wafer structure 111 has been described. However, the side wall insulating layer 51 may be formed only in the second device formation region 112B where the depth D of the recessed portion 41 is relatively large.

In each of the aforementioned embodiments, an example in which the depth D of the recessed portion 41 of the second device formation region 112B set at the peripheral portion of the semiconductor wafer structure 111 becomes larger than that of the first device formation region 112A set at the center portion of the semiconductor wafer structure 111 has been described.

However, depending on the manufacturing method, there is a case where the depth D of the recessed portion 41 of the second device formation region 112B set at the peripheral portion becomes smaller than that of the first device formation region 112A set at the center portion.

The area where the depth D of the recessed portion 41 becomes smaller may vary depending on the specification of the manufacturing equipment used during the manufacturing process, besides the manufacturing method. However, even in such a structure, it is possible to achieve substantially the same working effect as the working effect described with respect to the semiconductor device 1 by forming the side wall insulating layer 51 in the recessed portion 41.

In the first preferred embodiment and the third preferred embodiment described above, a structure in which only the POWER-MIS region 6 is formed without including the CMIS region 7 and the protection circuit region 8 may be adopted.

In the second preferred embodiment described above, a structure in which only the POWER-IGBT region 126 is formed without including the CMIS region 7 and the protection circuit region 8 may be adopted.

In each of the aforementioned embodiments, a structure in which the conductivity type of each semiconductor portion is inverted may be adopted. That is, the p-type portion may be inverted to the n-type and the n-type portion may be inverted to the p-type.

In each of the aforementioned embodiments, the semiconductor layer 2 may have a single layer structure including an $n^-$-type silicon semiconductor substrate formed by an FZ (Floating Zone) method.

In this case, in the first preferred embodiment and the third preferred embodiment, the drain region 24 is formed by introducing of n-type impurity into the second main surface 4 of the semiconductor layer 2. And a part of the $n^-$-type semiconductor substrate becomes the drain drift region 25.

On the other hand, in the second preferred embodiment, the $p^+$-type collector region 124 is formed by introducing of p-type impurity into the second main surface 4 of the semiconductor layer 2. And a part of the $n^-$-type semiconductor substrate becomes the $n^-$-type collector drift region 125.

This application corresponds to Japanese Patent Application No. 2017-020726 filed in the Japan Patent Office on Feb. 7, 2017, the disclosure of which is incorporated herein by reference in their entirety.

The preferred embodiments of the present invention, which have been described above in detail, are merely specific examples used to clarify the technical details of the present invention, and the present invention should not be construed as being limited to these specific examples. The scope of the present invention is to be limited only by the scope of the appended claims.

What is claimed is:

1. A semiconductor device comprising:
    a semiconductor layer of a first conductivity type having a main surface at which a trench is formed;
    a gate insulating layer formed along a side wall of the trench;
    a gate electrode embedded in the trench with the gate insulating layer interposed therebetween and having an upper surface located below the main surface of the semiconductor layer;
    a second conductivity type region formed in a surface layer portion of the main surface of the semiconductor layer and facing the gate electrode with the gate insulating layer interposed therebetween;
    a first conductivity type region formed in a surface layer portion of the second conductivity type region and facing the gate electrode with the gate insulating layer interposed therebetween; and
    a side wall insulating layer covering the side wall of the trench in a recessed portion defined by the side wall of the trench and the upper surface of the gate electrode.

2. The semiconductor device according to claim 1, wherein the side wall insulating layer covers the side wall of the trench with the gate insulating layer interposed therebetween in the recessed portion.

3. The semiconductor device according to claim 1, wherein the side wall insulating layer covers the side wall of the trench and the upper surface of the gate electrode in the recessed portion.

4. The semiconductor device according to claim 1, wherein the side wall insulating layer is formed along a corner portion formed by the side wall of the trench and the upper surface of the gate electrode.

5. The semiconductor device according to claim 1, wherein the side wall insulating layer has a curved surface protruding in a curved shape from the side wall of the trench toward the upper surface of the gate electrode.

6. The semiconductor device according to claim 1, wherein the side wall insulating layer includes a same insulating material as an insulating material of the gate insulating layer.

7. The semiconductor device according to claim 1, wherein the side wall insulating layer includes an insulating material different from insulating material of the gate insulating layer.

8. The semiconductor device according to claim 1 further comprising:
   a lower insulating layer formed along an inside wall of the trench in a region of the trench below the gate electrode;
   an embedded electrode embedded in the trench with the lower insulating layer interposed therebetween in a region of the trench below the gate electrode; and
   an intermediate insulating layer formed in a region between the gate electrode and the embedded electrode.

9. A manufacturing method of a semiconductor device comprising steps of:
   forming a trench at a main surface of a semiconductor wafer of a first conductivity type;
   forming a gate insulating layer along a side wall of the trench;
   embedding a gate electrode into the trench such that an upper surface of the gate electrode is to be located below the main surface of the semiconductor wafer;
   forming a second conductivity type region along the side wall of the trench by introducing a second conductivity type impurity into the surface layer portion of the main surface of the semiconductor wafer in a side of the trench;
   forming a side wall insulating layer covering the side wall of the trench in a recessed portion defined by the side wall of the trench and the upper surface of the gate electrode; and
   forming a first conductivity type region along the side wall of the trench in a surface layer portion of the second conductivity type region by introducing a first conductivity type impurity into the surface layer portion of the second conductivity type region via the side wall insulating layer.

10. The manufacturing method of the semiconductor device according to claim 9, wherein the step of forming the first conductivity type region includes a step of introducing the first conductivity type impurity into the surface layer portion of the second conductivity type region via the side wall insulating layer by an oblique ion implantation method.

11. The manufacturing method of the semiconductor device according to claim 9, wherein the step of forming the second conductivity type region includes a step of introducing the second conductivity type impurity into the surface layer portion of the main surface of the semiconductor wafer from the side wall of the trench by an oblique ion implantation method.

12. The manufacturing method of the semiconductor device according to claim 9, wherein the step of forming of the side wall insulating layer includes a step of forming an insulating layer along an inner wall of the recessed portion defined by the side wall of the trench and the upper surface of the gate electrode in addition to the main surface of the semiconductor wafer, and a step of selectively removing an unnecessary portion of the insulating layer such that a part covering the side wall of the trench in the insulating layer remains.

13. The manufacturing method of the semiconductor device according to claim 9, wherein the step of forming of the gate electrode includes
   a step of forming a conductive layer embedding the trench and covering the main surface of the semiconductor wafer, and
   a step of selectively removing an unnecessary portion of the conductive layer until an upper surface of the conductive layer reaches below the main surface of the semiconductor wafer in the trench.

14. A semiconductor wafer structure comprising:
   a semiconductor wafer of a first conductivity type set a first device formation region in which a first semiconductor device is to be formed and a second device formation region in which a second semiconductor device is to be formed, and having a main surface at which trenches are formed in each of the first device formation region and the second device formation region;
   wherein the first device formation region and the second device formation region each include
   a gate insulating layer formed along a side wall of the trench,
   a gate electrode embedded in the trench with the gate insulating layer interposed therebetween and having an upper surface located below the main surface of the semiconductor wafer,
   a second conductivity type region formed in a surface layer portion of the main surface of the semiconductor layer and facing the gate electrode with the gate insulating layer interposed therebetween, and
   a first conductivity type region formed in a surface layer portion of the second conductivity type region and facing the gate electrode with the gate insulating layer interposed therebetween,
   wherein the upper surface of the gate electrode formed in the second device formation region is located below the upper surface of the gate electrode formed in the first device formation region, and
   the second device formation region includes a side wall insulating layer covering the side wall of the trench in a recessed portion defined by the side wall of the trench and the upper surface of the gate electrode.

15. The semiconductor wafer structure according to claim 14, wherein the first device formation region includes the side wall insulating layer in addition to the second device formation region.

16. The semiconductor wafer structure according to claim 14, wherein a lower portion of the second conductivity type region formed in the second device formation region is located below a lower portion of the second conductivity type region formed in the first device formation region.

17. The semiconductor wafer structure according to claim 14, wherein the first device formation region is set at a center portion of the main surface of the semiconductor wafer, and
   the second device formation region is set at a side of a peripheral portion of the main surface of the semiconductor wafer with respect to the first device formation region.

18. The semiconductor wafer structure according to claim 14, wherein the second conductivity type region includes a channel formed in a region in which the second conductivity type region faces the gate electrode with the insulating layer interposed therebetween,
- an absolute value of a difference between a first channel length along a thickness direction of the semiconductor wafer in the channel formed in a first device formation region and a second channel length along the thickness direction of the semiconductor wafer in the channel formed in a second device formation region is equal to or greater than 0% and equal to or less than 10% of an average value obtained from the first channel length and the second channel length.

19. The semiconductor wafer structure according to claim 14, wherein the second conductivity type region includes a channel formed in a region in which the second conductivity type region faces the gate electrode with the insulating layer interposed therebetween,
- an absolute value of a difference between a first channel length along the thickness direction of the semiconductor wafer in the channel formed in a first device formation region and a second channel length along a thickness direction of the semiconductor wafer in the channel formed in a second device formation region is equal to or greater than 0 µm and equal to or less than 0.1 µm.

* * * * *